(12) United States Patent
Tamaso

(10) Patent No.: US 8,373,176 B2
(45) Date of Patent: Feb. 12, 2013

(54) SEMICONDUCTOR DEVICE AND METHOD OF MANUFACTURING THE SAME

(75) Inventor: Hideto Tamaso, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 47 days.

(21) Appl. No.: 12/937,450

(22) PCT Filed: Apr. 9, 2009

(86) PCT No.: PCT/JP2009/057265
§ 371 (c)(1),
(2), (4) Date: Oct. 12, 2010

(87) PCT Pub. No.: WO2009/128382
PCT Pub. Date: Oct. 22, 2009

(65) Prior Publication Data
US 2011/0031507 A1    Feb. 10, 2011

(30) Foreign Application Priority Data

Apr. 15, 2008    (JP) .................................. 2008-105739

(51) Int. Cl.
*H01L 29/15* (2006.01)
(52) U.S. Cl. .......................................... 257/77; 438/478
(58) Field of Classification Search .................... 257/77, 257/E21.054, E21.055, E21.065; 438/478
See application file for complete search history.

(56) References Cited

U.S. PATENT DOCUMENTS

| | | | |
|---|---|---|---|
| 4,990,994 A | 2/1991 | Furukawa et al. | |
| 5,124,779 A | 6/1992 | Furukawa et al. | |
| 5,920,794 A * | 7/1999 | Hong | 438/654 |
| 2004/0183080 A1 | 9/2004 | Kusumoto et al. | |
| 2006/0267022 A1* | 11/2006 | Mizukami et al. | 257/77 |
| 2008/0203400 A1 | 8/2008 | Fukuda et al. | |
| 2009/0160008 A1 | 6/2009 | Fujiwara et al. | |
| 2010/0102332 A1* | 4/2010 | Takahashi et al. | 257/77 |

FOREIGN PATENT DOCUMENTS

| | | |
|---|---|---|
| CN | 1172551 A | 2/1998 |
| CN | 1532943 A | 9/2004 |
| JP | 62071271 A | 4/1987 |
| JP | 3111566 A | 5/1991 |
| JP | 3133176 A | 6/1991 |

(Continued)

OTHER PUBLICATIONS

Tsukimoto et al., Simultaneous Formation of p- and n- Type Ohmic Contacts to 4H-SiC Using the Ternary Ni/Ti/Al System, No. 10, 2005, Journal of Electronic materials, vol. 34, pp. 1310-1312.*

(Continued)

*Primary Examiner* — Shaun Campbell
(74) *Attorney, Agent, or Firm* — Venable LLP; Michael A. Sartori

(57) ABSTRACT

A MOSFET representing a semiconductor device capable of achieving decrease in the number of steps in a manufacturing process and improvement in integration by including an electrode that can be in contact with any of a p-type SiC region and an n-type SiC region with contact resistance being sufficiently suppressed includes an $n^+$ SiC substrate, an $n^-$ SiC layer formed on the $n^+$ SiC substrate, and a source electrode arranged in contact with the $n^-$ SiC layer. The $n^-$ SiC layer includes an $n^+$ source region having an n conductivity type. The source electrode includes a source contact electrode arranged in contact with the $n^+$ source region and containing Ti, Al and Si.

14 Claims, 13 Drawing Sheets

FOREIGN PATENT DOCUMENTS

| | | | |
|---|---|---|---|
| JP | 2002075909 A | 3/2002 |
| JP | 2004304174 A | 10/2004 |
| JP | 2005033030 A | 2/2005 |
| JP | 2007013087 A | 1/2007 |
| JP | 2008227174 A | 9/2008 |
| WO | WO-96/22611 A1 | 7/1996 |

OTHER PUBLICATIONS

Tanimoto et al., "Practical Device-Directed Ohmic Contacts on 4H-SiC," IEICE Transactions C, the Institute of Electronics, Information and Communication Engineers, vol. J86-C, No. 4, pp. 359-367, Apr. 2003.

Hideto Tamaso, U.S. Appl. No. 12/937,435, "Semiconductor Device", Filed Oct. 12, 2010.

Hui et al., "Ti-Al Based Ohmic Contacts to n-type 6H-SiC with P Ion Implantation," Chinese Physics, vol. 15, No. 9, pp. 2142-2145 (Sep. 1, 2006).

Uemoto, T., "Reduction of Ohmic Contact Resistance on n-Type 6H-SiC by Heavy Doping," Japanese Journal of Applied Physics, vol. 34, No. 1A, Part 2, pp. L7-L9 (Jan. 1, 1995).

Wenzel et al., "Diffusion Barriers on Titanium-Based Ohmic Contact Structures on SiC," 1998 High-Temperature Electronic Materials, Devices and Sensors Conference, IEEE New York, NY, pp. 159-164 (1998).

Chang et al., "Investigation of Au/Ti/Al Ohmic Contact to n-Type 4H-SiC," Solid-State Electronics, vol. 49, No. 12, pp. 1937-1941 (Dec. 1, 2005).

Ryu et al., "10-kV, 123-m$\Omega\cdot$cm$^2$ 4H-SiC Power DMOSFETs," IEEE Electron Device Letters, vol. 25, No. 8, pp. 556-558 (Aug. 1, 2004).

\* cited by examiner

SEMICONDUCTOR DEVICE AND METHOD OF MANUFACTURING THE SAME

TECHNICAL FIELD

The present invention relates to a semiconductor device and a method of manufacturing the same, and more particularly to a semiconductor device including an electrode arranged in contact with an SiC layer composed of silicon carbide and a method of manufacturing the same.

BACKGROUND ART

In a semiconductor device, in many cases, a structure in which an n-type region having an n conductivity type and a p-type region having a p conductivity type are formed and an electrode is connected to the n-type region and the p-type region is adopted. With higher efficiency being achieved in recent years in an apparatus where a semiconductor device is included, a semiconductor device is also required to achieve higher efficiency. In order to achieve higher efficiency of a semiconductor device, the electrode above should be low not only in its own resistance (electrical resistance) but also in contact resistance with the n-type region and the p-type region above.

Meanwhile, in order to achieve a higher withstand voltage and lower loss of a semiconductor device and to enable use thereof in an environment at a high temperature, silicon carbide (SiC) has recently been adopted as a material for forming a semiconductor device. SiC is a wide-bandgap semiconductor greater in bandgap than silicon (Si) that has conventionally widely been used as a material for forming a semiconductor device. Therefore, by adopting SiC as a material for forming a semiconductor device, a higher withstand voltage, a lower ON resistance and the like of a semiconductor device can be achieved. In addition, a semiconductor device adopting SiC as a material is also advantageous in that lowering in characteristics when used in an environment at a high temperature is less likely than in a semiconductor device adopting Si as a material.

In adopting SiC as a material for a semiconductor device, however, it is difficult to avoid increase in Schottky barrier between a p-type region, an n-type region and an electrode as compared with an example where Si is adopted as a material for a semiconductor device. Consequently, a problem of difficulty in suppression of increase in contact resistance between a p-type region, an n-type region and an electrode has arisen.

In contrast, it has been known that contact resistance can be lowered by adopting Ni (nickel) as a material for an electrode in contact with an n-type SiC region containing an n-type impurity (an impurity having an n conductivity type) and adopting Ti (titanium)/Al (aluminum) or AlSi alloy as a material for an electrode in contact with a p-type SiC region containing a p-type impurity (an impurity having a p conductivity type) (see, for example, Satoshi TANIMOTO et al., "Practical Device-Directed Ohmic Contacts on 4H—SiC," IEICE Transactions C, the Institute of Electronics, Information and Communication Engineers, April 2003, Vol. J86-C, No. 4, pp. 359-367 (Non-Patent Document 1)).

PRIOR ART DOCUMENTS

Non-Patent Documents

Non-Patent Document 1: Satoshi TANIMOTO et al., "Practical Device-Directed Ohmic Contacts on 4H—SiC," IEICE Transactions C, the Institute of Electronics, Information and Communication Engineers, April 2003, Vol. J86-C, No. 4, pp. 359-367

SUMMARY OF THE INVENTION

Problems to be Solved by the Invention

As described above, by appropriately selecting a material for forming an electrode in accordance with whether a region in contact with an electrode is an n-type SiC region or a p-type SiC region, contact resistance between a p-type region, an n-type region and an electrode can be lowered even when SiC is adopted as a material for a semiconductor device. If a material for forming an electrode in contact with the p-type region is different from a material for forming an electrode in contact with the n-type region, however, a plurality of steps for forming these electrodes are required, which leads to increase in the number of steps in a manufacturing process. Consequently, a problem of increase in manufacturing cost of a semiconductor device arises. In addition, difference between a material for forming an electrode in contact with the p-type region and a material for forming an electrode in contact with the n-type region may prevent improvement in integration of a semiconductor device.

From the foregoing, an object of the present invention is to provide a semiconductor device capable of achieving decrease in the number of steps in a manufacturing process and improvement in integration by including an electrode that can be in contact with any of a p-type SiC region and an n-type SiC region with contact resistance being sufficiently suppressed and a method of manufacturing the same.

Means for Solving the Problems

A semiconductor device according to the present invention includes a substrate, an SiC layer formed on the substrate and composed of silicon carbide, and an electrode arranged in contact with the SiC layer. The SiC layer above includes an n-type region having an n conductivity type. The electrode above includes an ohmic contact electrode arranged in contact with the n-type region and containing titanium, aluminum and silicon.

The present inventor conducted detailed studies of materials for an electrode that can be in contact with any of a p-type SiC region and an n-type SiC region with contact resistance being sufficiently suppressed. Consequently, the following findings were made.

In general, in many cases, Ni is adopted as a material for an electrode in contact with an n-type SiC region. Meanwhile, in a DMOS-type vertical MOSFET (Metal Oxide Semiconductor Field Effect Transistor) including, for example, SiC as a material, a structure in which an electrode composed of Ni is in contact with both of a p-type SiC region and an n-type SiC region is adopted. This is because the DMOS-type vertical MOSFET requires an electrode in contact with both of the p-type region and the n-type region, while an electrode composed of Ni can be in contact also with the p-type SiC region at contact resistivity around $10^{-2} \Omega \cdot cm^2$. Though this contact resistivity of $10^{-2} \Omega \cdot cm^2$ indicates a numeric value allowing use as an ohmic contact electrode, contact resistance between the electrode composed of Ni and the p-type SiC region is not sufficiently low, taking into account the fact that an electrode composed of Ti/Al can be in contact with the p-type SiC region at contact resistivity around $10^{-3} \Omega \cdot cm^2$.

On the other hand, in an example where an electrode composed of Ti/Al is adopted, though contact resistance with the p-type SiC region is sufficiently suppressed, contact resistivity with the n-type SiC region is around $10^{-3}\Omega\cdot cm^2$. This contact resistivity of $10^{-3}\Omega\cdot cm^2$ also indicates a numeric value allowing use as an ohmic contact electrode, however, contact resistance between the electrode composed of Ti/Al and the n-type SiC region is not sufficiently low, taking into account the fact that an electrode composed of Ni can be in contact with the n-type SiC region at contact resistivity around $10^{-6}\Omega\cdot cm^2$.

As a result of further study of a material for an electrode in consideration of relation between such a material for an electrode and contact resistance with the p-type SiC region and the n-type SiC region, the present inventor has found that contact resistance with any of the p-type SiC region and the n-type SiC region can sufficiently be suppressed by adopting an alloy containing Ti, Al and Si as a material for an electrode.

In the semiconductor device according to the present invention, an electrode arranged in contact with the SiC layer includes an ohmic contact electrode arranged in contact with the n-type region and containing Ti, Al and Si. This ohmic contact electrode can be in contact with the p-type SiC region at contact resistance comparable to that of an electrode composed of Ti/Al and can also be in contact with the n-type SiC region at contact resistance comparable to that of an electrode composed of Ni. Consequently, according to the semiconductor device of the present invention, a semiconductor device capable of achieving decrease in the number of steps in a manufacturing process and improvement in integration by including an electrode that can be in contact with any of the p-type SiC region and the n-type SiC region with contact resistance being sufficiently suppressed can be provided.

In the semiconductor device above, preferably, the ohmic contact electrode above contains aluminum at least 1.58 times and at most 6.33 times as much as titanium in terms of an atomic ratio.

For practical adoption as an ohmic contact electrode, preferably, contact resistance with the p-type SiC region is not higher than approximately $1\times10^{-3}\Omega\cdot cm^2$ and contact resistance with the n-type SiC region is not higher than approximately $1\times10^{-4}\Omega\cdot cm^2$. Here, the inventor examined relation of contact resistance between an electrode containing Ti, Al and Si and the p-type SiC region, the n-type SiC region with a composition of the electrode. Then, it became clear that too high an atomic ratio of Al to Ti leads to increase in contact resistance between the electrode and the n-type SiC region, while too low an atomic ratio leads to increase in contact resistance between the electrode and the p-type SiC region. In addition, it was found that, when the atomic ratio above is lower than 1.58, contact resistance between the electrode and the p-type SiC region exceeds $1\times10^{-3}\Omega\cdot cm^2$. Moreover, it was found that, when the atomic ratio above exceeds 6.33, contact resistance between the electrode and the n-type SiC region exceeds $1\times10^{-4}\Omega\cdot cm^2$. From the foregoing, it can be concluded that an ohmic contact electrode preferably contains Al at least 1.58 times and at most 6.33 times as much as Ti in terms of an atomic ratio. Further, in order to further lower contact resistance between the electrode and the p-type SiC region, the atomic ratio above is preferably not lower than 2.11, and in order to further lower contact resistance between the electrode and the n-type SiC region, the atomic ratio above is preferably not higher than 4.22.

In the semiconductor device above, preferably, the SiC layer further includes a p-type region having a p conductivity type. In addition, the ohmic contact electrode is arranged to extend from a region in contact with the n-type region to a region in contact with the p-type region.

The ohmic contact electrode above that can be in contact with any of the p-type SiC region and the n-type SiC region with contact resistance being sufficiently suppressed is arranged to extend from the region in contact with the n-type region to the region in contact with the p-type region, so that further decrease in the number of steps in a manufacturing process and improvement in integration can be achieved.

The semiconductor device above preferably further includes another electrode different from the electrode above, that is arranged in contact with the SiC layer. In addition, the SiC layer further includes a p-type region having a p conductivity type. Another electrode includes another ohmic contact electrode different from the ohmic contact electrode above, that is arranged in contact with the p-type region and contains titanium, aluminum and silicon.

The ohmic contact electrode above and another ohmic contact electrode that can be in contact with any of the p-type SiC region and the n-type SiC region with contact resistance being sufficiently suppressed are arranged in contact with the n-type region and the p-type region respectively, so that further decrease in the number of steps in a manufacturing process and improvement in integration can be achieved.

It is noted that a material for forming another ohmic contact electrode above is preferably the same as a material for forming the ohmic contact electrode above. Thus, in the process for manufacturing a semiconductor device, the ohmic contact electrode above and another ohmic contact electrode above can readily be formed simultaneously, and hence the number of steps in the manufacturing process can further be decreased.

In the semiconductor device above, preferably, another ohmic contact electrode above contains aluminum at least 1.58 times and at most 6.33 times as much as titanium in terms of an atomic ratio.

As described above, in consideration of achieving both of lower contact resistance with the p-type SiC region and lower contact resistance with the n-type SiC region, another ohmic contact electrode above preferably also contains Al at least 1.58 times and at most 6.33 times as much as Ti in terms of an atomic ratio. In addition, in order to further lower contact resistance between another electrode above and the p-type SiC region, the atomic ratio above is preferably not lower than 2.11, and in order to further lower contact resistance between another electrode above and the n-type SiC region, the atomic ratio above is preferably not higher than 4.22.

A method of manufacturing a semiconductor device according to the present invention includes the steps of preparing a substrate, forming on the substrate, an SiC layer composed of silicon carbide and including an n-type region having an n conductivity type, and forming an electrode to be in contact with the SiC layer. The step of forming an electrode includes the step of forming an ohmic contact electrode arranged in contact with the n-type region and containing titanium, aluminum and silicon.

According to the method of manufacturing a semiconductor device of the present invention, an ohmic contact electrode that can be in contact with the p-type SiC region at contact resistance comparable to that of an electrode composed of Ti/Al and in contact with the n-type SiC region at contact resistance comparable to that of an electrode composed of Ni, by containing Ti, Al and Si, is formed. Therefore, according to the method of manufacturing a semiconductor device of the present invention, decrease in the number of steps in the process for manufacturing a semiconductor device and improvement in integration in a semiconductor device can be achieved.

In the method of manufacturing a semiconductor device above, the step of forming an ohmic contact electrode can include the steps of forming a Ti layer composed of titanium on the n-type region, forming an Al layer composed of aluminum on the Ti layer, forming an Si layer composed of silicon on the Al layer, and generating an alloy containing titanium, aluminum and silicon by heating the Ti layer, the Al layer and the Si layer.

In forming an ohmic contact electrode containing Ti, Al and Si on the n-type region, a process in which a Ti layer, an Al layer and an Si layer are formed on the n-type region followed by heating, to thereby generate an alloy containing Ti, Al and Si can be adopted. Here, Al and Ti more likely to be oxidized as a result of contact with oxygen are covered with Si less likely to be oxidized than Al and Ti, so that oxidation of Al and Ti in subsequent steps can be suppressed. In addition, by bringing Si in contact with Al low in melting point, Al and Si form an alloy before Al melts and flows to surrounding regions in a subsequent step, so that flow of Al to surrounding regions can be suppressed. Further, an alloy of Al and Si is less likely to be oxidized than a single substance of Al.

Therefore, initially, a Ti layer, an Al layer and an Si layer are formed in this order on the n-type region and thereafter heating treatment for forming an alloy is performed, so that heating treatment can be performed while the Ti layer and the Al layer are covered with the Si layer and the Al layer and the Si layer are in contact with each other. Consequently, while suppressing oxidation of Ti and Al and suppressing flow of Al to surrounding regions, an alloy containing Ti, Al and Si can be generated and a stable ohmic contact electrode can be formed.

In the method of manufacturing a semiconductor device above, preferably, in the step of forming an Al layer above, the Al layer at least 1.5 times and at most 6 times as thick as the Ti layer is formed.

As described above, for practical adoption as an ohmic contact electrode, preferably, contact resistance with the p-type SiC region is not higher than approximately $1 \times 10^{-3} \Omega \cdot cm^2$ and contact resistance with the n-type SiC region is not higher than approximately $1 \times 10^{-4} \Omega \cdot cm^2$. Here, the inventor examined relation of thicknesses of the Ti layer, the Al layer and the Si layer with contact resistance between a fabricated ohmic contact electrode and the p-type SiC region, the n-type SiC region in an example where an ohmic contact electrode is fabricated in a procedure of successively forming the Ti layer, the Al layer and the Si layer and thereafter alloying the same. Then, it became clear that too high a ratio of a thickness of the Al layer to the Ti layer leads to increase in contact resistance between the electrode and the n-type SiC region, while too low a ratio of thickness leads to increase in contact resistance between the electrode and the p-type SiC region. It was found that, when the ratio of thickness above is lower than 1.5, contact resistance between the electrode and the p-type SiC region exceeds $1 \times 10^{-3} \Omega \cdot cm^2$. In addition, it was found that, when the ratio of thickness above exceeds 6, contact resistance between the electrode and the n-type SiC region exceeds $1 \times 10^{-4} \Omega \cdot cm^2$. From the foregoing, in the step of forming an Al layer above, an Al layer at least 1.5 times and at most 6 times as thick as a Ti layer is preferably formed. Moreover, in order to further lower contact resistance between the electrode and the p-type SiC region, the ratio of thickness above is preferably not lower than 2.0, and in order to further lower contact resistance between the electrode and the n-type SiC region, the ratio of thickness above is preferably not higher than 4.0.

If a Ti layer formed in the step of forming a Ti layer above has a thickness smaller than 100 Å, a problem of difficulty in achieving reproducibility due to unevenness in a process may arise. Therefore, a Ti layer to be formed preferably has a thickness not smaller than 100 Å. On the other hand, if a Ti layer formed in the step of forming a Ti layer above has a thickness exceeding 400 Å, a problem that reaction between Al and SiC is interfered and characteristics become poorer may arise. Therefore, a Ti layer to be formed preferably has a thickness not greater than 400 Å. Moreover, if an Si layer formed in the step of forming an Si layer above has a thickness smaller than 100 Å, this thickness may not be great enough for generating an alloy, even though Al has a sufficiently small thickness. Therefore, an Si layer to be formed preferably has a thickness not smaller than 100 Å. On the other hand, if an Si layer formed in the step of forming an Si layer above has a thickness exceeding 500 Å, a problem that Si does not react to Al and it remains as a high-resistance layer may arise. Therefore, an Si layer to be formed preferably has a thickness not greater than 500 Å.

In the method of manufacturing a semiconductor device above, preferably, in the step of generating an alloy above, the Ti layer, the Al layer and the Si layer above are heated in a gas mixture of an inert gas and hydrogen ($H_2$).

Thus, contact resistance between a fabricated ohmic contact electrode and the p-type SiC region, the n-type SiC region can be lowered in a stable manner. Here, an inert gas includes such noble gases as argon (Ar) and helium (He) as well as nitrogen ($N_2$). In addition, from a point of view of forming an ohmic contact electrode with reduced cost for manufacturing a semiconductor device, an atmosphere for heating the Ti layer, the Al layer and the Si layer above is more preferably a gas mixture of Ar and $H_2$ or a gas mixture of $N_2$ and $H_2$.

In the method of manufacturing a semiconductor device above, preferably, the step of forming an ohmic contact electrode above further includes the step of forming a Pt layer composed of platinum on the Si layer before the step of generating an alloy above.

Thus, oxidation of Al and Ti in subsequent steps can further effectively be suppressed, and an ohmic contact electrode with contact resistance with the p-type SiC region and the n-type SiC region being suppressed can be fabricated in a stable manner.

In the method of manufacturing a semiconductor device above, the step of forming an ohmic contact electrode can include the steps of forming a mixture layer containing titanium, aluminum and silicon on the n-type region and generating an alloy containing titanium, aluminum and silicon by heating the mixture layer.

In forming an ohmic contact electrode containing Ti, Al and Si on the n-type region, a process in which a mixture layer containing Ti, Al and Si is initially formed on the n-type region followed by heating, to thereby generate an alloy containing Ti, Al and Si can be adopted. Thus, a stable ohmic contact electrode can be formed, with the manufacturing process being simplified.

In the method of manufacturing a semiconductor device above, preferably, in the step of forming a mixture layer, the mixture layer containing aluminum at least 1.58 times and at most 6.33 times as much as titanium in terms of an atomic ratio is formed.

As described above, in consideration of achieving both of lower contact resistance with the p-type SiC region and lower contact resistance with the n-type SiC region, the ohmic contact electrode above preferably contains Al at least 1.58 times and at most 6.33 times as much as Ti in terms of an atomic ratio. Therefore, by forming a mixture layer containing Al at least 1.58 times and at most 6.33 times as much as Ti in terms of an atomic ratio in the mixture layer above, lowering in contact resistance with the p-type SiC region and lowering in contact resistance with the n-type SiC region can both be achieved at more preferred level. In addition, in order to further lower contact resistance between the electrode and the p-type SiC region, the atomic ratio above is preferably not lower than 2.11, and in order to further lower contact resistance between the electrode and the n-type SiC region, the atomic ratio above is preferably not higher than 4.22.

In the method of manufacturing a semiconductor device above, preferably, in the step of generating an alloy above, the mixture layer above is heated in a gas mixture of an inert gas and hydrogen.

Thus, contact resistance between a fabricated ohmic contact electrode and the p-type SiC region, the n-type SiC region can be lowered in a stable manner. In addition, from a point of view of forming an ohmic contact electrode with reduced cost for manufacturing a semiconductor device, an atmosphere for heating the mixture layer above is more preferably a gas mixture of Ar and $H_2$ or a gas mixture of $N_2$ and $H_2$.

In the method of manufacturing a semiconductor device above, preferably, the step of forming an ohmic contact electrode further includes the step of forming a Pt layer composed of platinum on the mixture layer above before the step of generating an alloy above.

Thus, oxidation of an alloy layer in subsequent steps can effectively be suppressed, and an ohmic contact electrode with contact resistance with the p-type SiC region and the n-type SiC region being suppressed can be fabricated in a stable manner.

In the method of manufacturing a semiconductor device above, preferably, in the step of forming an SiC layer, the SiC layer further including a p-type region having a p conductivity type is formed. In the step of forming an ohmic contact electrode, the ohmic contact electrode is formed to extend from a region in contact with the n-type region to a region in contact with the p-type region.

The ohmic contact electrode above that can be in contact with any of the p-type SiC region and the n-type SiC region with contact resistance being sufficiently suppressed is formed to extend from the region in contact with the n-type region to the region in contact with the p-type region, so that further decrease in the number of steps in a process for manufacturing a semiconductor device and improvement in integration in a semiconductor device can be achieved.

The method of manufacturing a semiconductor device above preferably further includes the step of forming another electrode different from the electrode above, to be in contact with the SiC layer. In addition, in the step of forming an SiC layer, the SiC layer further including a p-type region having a p conductivity type is formed. Moreover, the step of forming another electrode above further includes the step of forming another ohmic contact electrode different from the ohmic contact electrode above, that is arranged in contact with the p-type region and contains titanium, aluminum and silicon. The step of forming an ohmic contact electrode and the step of forming another ohmic contact electrode are simultaneously performed.

By simultaneously forming the ohmic contact electrode in contact with the p-type SiC region and the ohmic contact electrode in contact with the n-type SiC region, the number of steps in the manufacturing process can further be decreased.

It is noted that a material for forming another ohmic contact electrode above is preferably the same as a material for forming the ohmic contact electrode above. Thus, the ohmic contact electrode above and another ohmic contact electrode above can readily be formed simultaneously.

Effects of the Invention

As can clearly be understood from the description above, according to the semiconductor device and the method of manufacturing the same of the present invention, a semiconductor device capable of achieving decrease in the number of steps in a manufacturing process and improvement in integration by including an electrode that can be in contact with any of a p-type SiC region and an n-type SiC region with contact resistance being sufficiently suppressed and a method of manufacturing the same can be provided.

MODES FOR CARRYING OUT THE INVENTION

Figure 1:
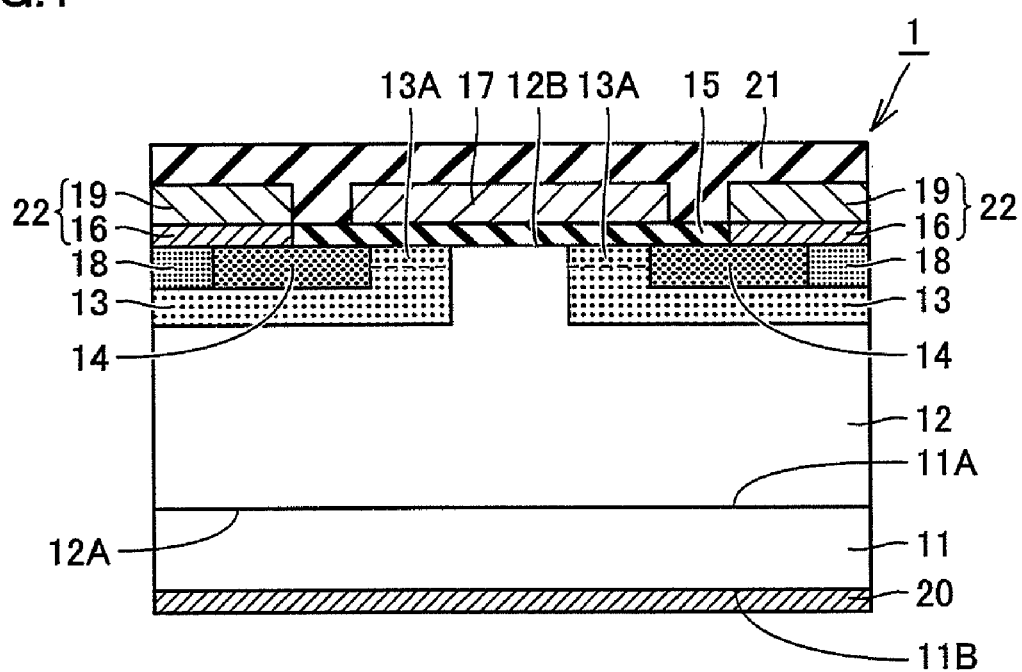
FIG. 1 is a schematic cross-sectional view showing a structure of a MOSFET representing a semiconductor device in a first embodiment.

An embodiment of the present invention will be described hereinafter with reference to the drawings. In the drawings below, the same or corresponding elements have the same reference characters allotted and description thereof will not be repeated.

First Embodiment

Initially, a MOSFET in the first embodiment will be described. Referring to FIG. 1, a MOSFET 1 in the first embodiment includes an $n^+$ SiC substrate 11 being a substrate composed of silicon carbide (SiC) and having an n conductivity type (a first conductivity type), an $n^-$ SiC layer 12 serving as a semiconductor layer composed of SiC and having the n conductivity type (the first conductivity type), a pair of p bodies 13 serving as second-conductivity-type regions having a p conductivity type (a second conductivity type), an $n^+$ source region 14 serving as a high-concentration first-conductivity-type region having the n conductivity type (the first conductivity type), and a $p^+$ region 18 serving as a high-concentration second-conductivity-type region having the p conductivity type (the second conductivity type). $N^+$ SiC substrate 11 contains an n-type impurity (an impurity having the n conductivity type) such as N (nitrogen) at high concentration.

$N^-$ SiC layer 12 is formed on one main surface 11A of $n^+$ SiC substrate 11, for example, to a thickness of approximately 10 μm, and it has the n conductivity type by containing an n-type impurity. Examples of n-type impurities contained in $n^-$ SiC layer 12 include N (nitrogen), and an impurity is contained at concentration lower than concentration of an n-type impurity contained in $n^+$ SiC substrate 11, for example, at concentration of $5 \times 10^{15}$ cm$^{-3}$.

A pair of p bodies 13 is formed such that the p bodies are separate from each other so as to include a second main surface 12B of $n^-$ SiC layer 12, which is a main surface opposite to a first main surface 12A which is a main surface on the $n^+$ SiC substrate 11 side, and the pair has the p conductivity type (the second conductivity type) by containing a p-type impurity (an impurity having the p conductivity type). For example, Al, B (boron), or the like is adopted as a p-type impurity to be contained in p body 13, and it is contained at concentration lower than concentration of the n-type impurity contained in $n^+$ SiC substrate 11, for example, at concentration of $1 \times 10^{17}$ cm$^{-3}$.

$N^+$ source region 14 is formed within each p body 13 so as to include second main surface 12B and to be surrounded by p body 13. $N^+$ source region 14 contains an n-type impurity such as P (phosphorus) at concentration higher than concentration of the n-type impurity contained in $n^-$ SiC layer 12, for example, at concentration of $1 \times 10^{20}$ cm$^{-3}$.

$P^+$ region 18 is formed to include second main surface 12B, on the side opposite to $n^+$ source region 14 formed within the other p body 13, when viewed from $n^+$ source region 14 formed within one p body 13 of the pair of p bodies 13. $P^+$ region 18 contains a p-type impurity such as Al or B at concentration higher than concentration of the p-type impurity contained in p body 13, for example, at concentration of $1 \times 10^{20}$ cm$^{-3}$.

Referring further to FIG. 1, MOSFET 1 includes a gate oxide film 15 serving as a gate insulating film, a gate electrode 17, a pair of source contact electrodes 16, a source interconnection 19, a drain electrode 20, and a passivation film 21.

Gate oxide film 15 is formed on second main surface 12B of if SiC layer 12 so as to be in contact with second main surface 12B and to extend from an upper surface of one $n^+$ source region 14 to an upper surface of the other $n^+$ source region 14, and it is composed, for example, of silicon dioxide (SiO$_2$).

Gate electrode 17 is arranged in contact with gate oxide film 15 so as to extend from one $n^+$ source region 14 to the other $n^+$ source region 14 over the same. In addition, gate electrode 17 is made of a conductor such as polysilicon, Al or the like.

Source contact electrode 16 is arranged in contact with second main surface 12B, so as to extend from a pair of $n^+$ source regions 14, in a direction away from gate oxide film 15, to $p^+$ region 18. In addition, source contact electrode 16 contains Ti, Al and Si. More specifically, source contact electrode 16 contains Ti, Al, Si, and C (carbon) as well as a remaining impurity such as O (oxygen).

Source interconnection 19 is formed in contact with source contact electrode 16 and it is made of a conductor such as Al. Source interconnection 19 is electrically connected to $n^+$ source region 14 through source contact electrode 16. This source interconnection 19 and source contact electrode 16 constitute a source electrode 22.

Drain electrode 20 is formed in contact with the other main surface 11B of $n^+$ SiC substrate 11, which is a main surface opposite to one main surface 11A which is a main surface on a side where $n^-$ SiC layer 12 is formed. For example, this drain electrode 20 may be made of a material containing Ti, Al and Si, as in source contact electrode 16 above, or it may be made of another material capable of establishing ohmic contact with $n^+$ SiC substrate 11, such as Ni. Thus, drain electrode 20 is electrically connected to $n^+$ SiC substrate 11.

Passivation film 21 is formed to extend from one source interconnection 19 over gate electrode 17 to the other source interconnection 19. This passivation film 21 is composed, for example, of SiO$_2$ and it has a function to electrically isolate source interconnection 19 and gate electrode 17 from outside and to protect MOSFET 1.

Namely, MOSFET 1 in the present embodiment includes $n^+$ SiC substrate 11, $n^-$ SiC layer 12 serving as the SiC layer formed on $n^+$ SiC substrate 11 and composed of silicon carbide, and source electrode 22 arranged in contact with $n^-$ SiC layer 12. In addition, $n^-$ SiC layer 12 includes $n^+$ source region 14 serving as the n-type region having the n conductivity type. Source electrode 22 includes source contact electrode 16 serving as an ohmic contact electrode arranged in contact with n+ source region 14 and containing Ti, Al and Si. In addition, in MOSFET 1 in the present embodiment, n− SiC layer 12 includes p+ region 18 serving as the p-type region having the p conductivity type. Moreover, source contact electrode 16 is arranged to extend from the region in contact with n+ source region 14 to the region in contact with p+ region 18.

In MOSFET 1 in the present embodiment, source electrode 22 arranged in contact with n− SiC layer 12 includes source contact electrode 16 arranged in contact with n+ source region 14 and containing Ti, Al and Si. This source contact electrode 16 can be in contact with p+ region 18 at contact resistance comparable to that of an electrode composed of Ti/Al and in contact with n+ source region 14 at contact resistance comparable to that of an electrode composed of Ni. This source contact electrode 16 is arranged to extend from the region in contact with n+ source region 14 to the region in contact with p+ region 18. Consequently, MOSFET 1 in the present embodiment is a semiconductor device capable of achieving decrease in the number of steps in a manufacturing process and improvement in integration.

More specifically, in MOSFET 1 in the present embodiment having a DMOS structure, it is necessary to hold n+ source region 14 and p body 13 at the same potential. Therefore, source contact electrode 16 is required to electrically be connected to both of n+ source region 14 and p body 13 with contact resistance being lowered. In addition, in MOSFET 1, in order to lower ON resistance, n+ source region 14 and source contact electrode 16 should electrically be connected to each other with contact resistance being suppressed. In this connection, source contact electrode 16 in MOSFET 1 in the present embodiment is in contact with both of n+ source region 14 and p body 13 (p+ region 18) at low contact resistance, by containing Ti, Al and Si. Consequently, MOSFET 1 is a semiconductor device capable of achieving decrease in the number of steps in a manufacturing process and improvement in integration.

In addition, source contact electrode 16 preferably contains Al at least 1.58 times and at most 6.33 times as much as Ti in terms of an atomic ratio. Thus, contact resistance between source contact electrode 16 and n+ source region 14, p body 13 (p+ region 18) can more reliably be lowered.

An operation of MOSFET 1 will now be described. Referring to FIG. 1, in such a state that a voltage not higher than a threshold value is applied to gate electrode 17, that is, in an OFF state, a portion between p body 13 located directly under gate oxide film 15 and n− SiC layer 12 is reverse-biased and in a non-conducting state. On the other hand, as a positively increasing voltage is applied to gate electrode 17, an inversion layer is formed in a channel region 13A, which is a region around a portion of contact of p body 13 with gate oxide film 15. Consequently, n+ source region 14 and n− SiC layer 12 are electrically connected to each other and a current flows between source electrode 22 and drain electrode 20.

Figure 2:
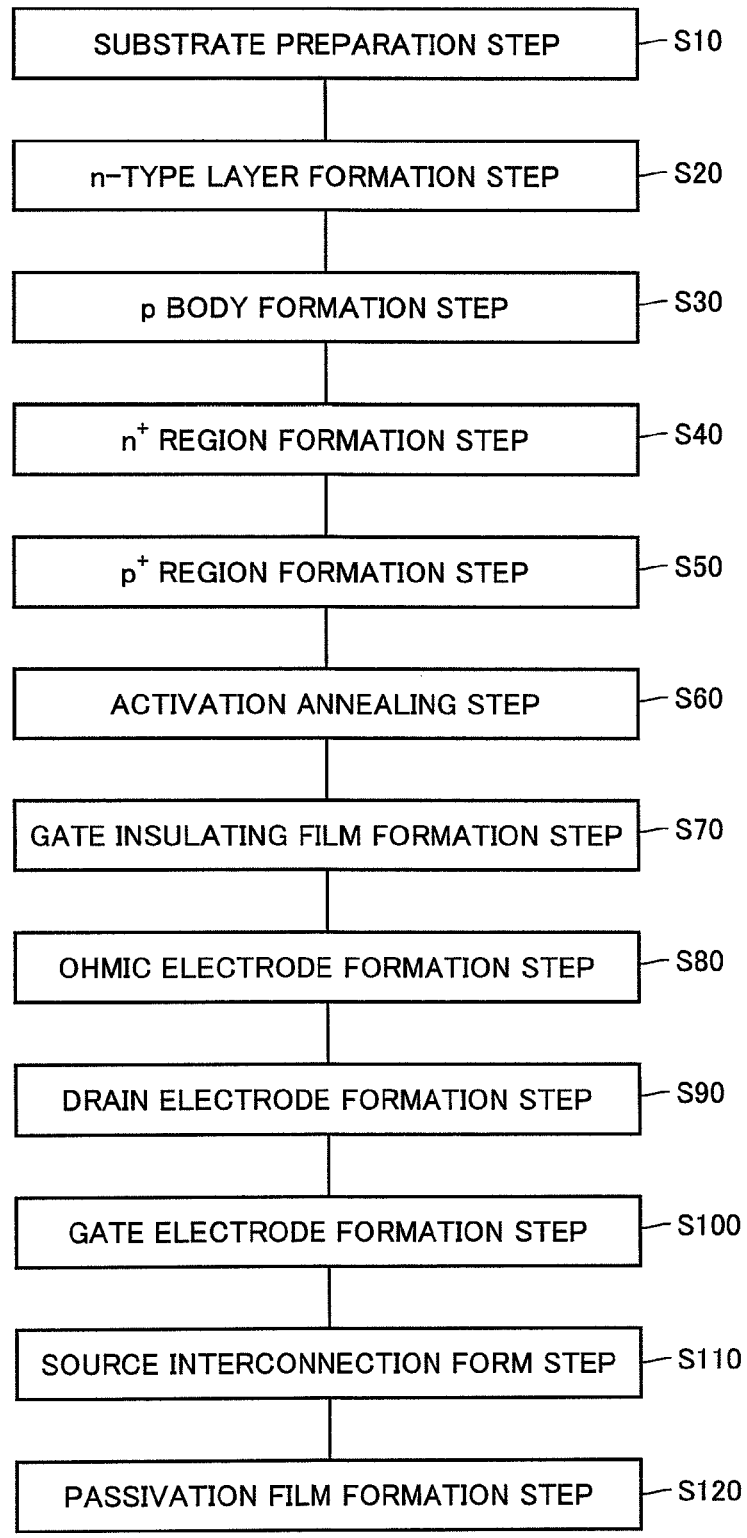
FIG. 2 is a flowchart showing outlines of a method of manufacturing a MOSFET in the first embodiment.
Figure 4:
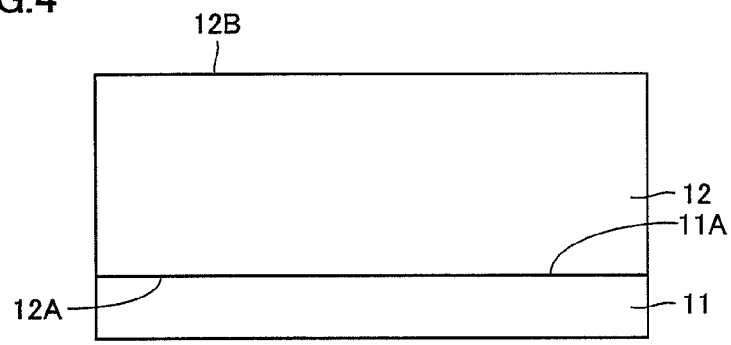
FIG. 4 is a schematic cross-sectional view for illustrating a method of manufacturing a MOSFET in the first embodiment.

A method of manufacturing a MOSFET representing a semiconductor device in the first embodiment representing one embodiment of a method of manufacturing a semiconductor device according to the present invention will now be described. Referring to FIG. 2, in the method of manufacturing a MOSFET in the first embodiment, initially, in a step (S10), a substrate preparation step is performed. In this step (S10), an SiC substrate of the first conductivity type is prepared. Specifically, referring to FIG. 4, for example, n+ SiC substrate 11 composed of hexagonal SiC and having the n conductivity type by containing an n-type impurity is prepared.

Referring next to FIG. 2, in a step (S20), an n-type layer formation step is performed. In this step (S20), a semiconductor layer of the first conductivity type is formed on n+ SiC substrate 11. Specifically, referring to FIG. 4, n− SiC layer 12 is formed on one main surface 11A of n+ SiC substrate 11 through epitaxial growth. Epitaxial growth can be achieved, for example, by adopting a gas mixture of $SiH_4$ (silane) and $C_3H_8$ (propane) as a source gas. Here, for example, N is introduced as the n-type impurity. Thus, n− SiC layer 12 containing an n-type impurity at concentration lower than concentration of an n-type impurity contained in n+ SiC substrate 11 can be formed.

Figure 5:
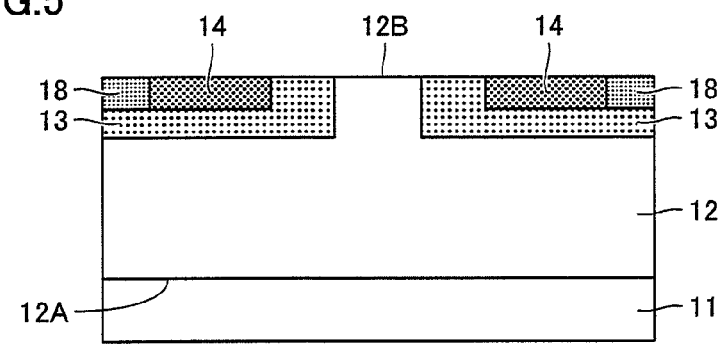
FIG. 5 is a schematic cross-sectional view for illustrating the method of manufacturing a MOSFET in the first embodiment.

Referring next to FIG. 2, in a step (S30), a p body formation step is performed. In this step (S30), referring to FIG. 5, a second-conductivity-type region having the second conductivity type is formed so as to include second main surface 12B of n− SiC layer 12, which is the main surface opposite to first main surface 12A which is the main surface on the n+ SiC substrate 11 side. Specifically, initially, an oxide film composed of $SiO_2$ is formed on second main surface 12B, for example, with CVD (Chemical Vapor Deposition). Then, after a resist is applied onto the oxide film, exposure and development are performed to thereby form a resist film having an opening in a region in conformity with a desired shape of p body 13 serving as the second-conductivity-type region. Using this resist film as a mask, the oxide film is partially removed, for example, through RIE (Reactive Ion Etching), and a mask layer formed of the oxide film having an opening pattern is formed on n− SiC layer 12. Thereafter, the resist film above is removed. Then, using this mask layer as a mask, ion implantation of a p-type impurity such as Al in n− SiC layer 12 is performed, to thereby form p body 13 in n− SiC layer 12.

Referring next to FIG. 2, in a step (S40), an n+ region formation step is performed. In this step (S40), a high-concentration first-conductivity-type region containing an impurity having the first conductivity type at concentration higher than in n− SiC layer 12 is formed in a region within p body 13 including second main surface 12B. Specifically, referring to FIG. 5, initially, after the oxide film above used as the mask in the step (S30) is removed, a mask layer having an opening in a region in conformity with a desired shape of n+ source region 14 is formed in accordance with a procedure similar to the step (S30). Using this mask layer as a mask, an n-type impurity such as P is introduced in n− SiC layer 12 through ion implantation, to thereby form n+ source region 14.

Referring next to FIG. 2, in a step (S50), a p+ region formation step is performed. In this step (S50), referring to FIG. 5, a high-concentration second-conductivity-type region (p+ region 18) is formed to include second main surface 12B on the side opposite to n+ source region 14 formed within the other p body 13, when viewed from n+ source region 14 formed within one p body 13 of the pair of p bodies 13. Specifically, referring to FIG. 5, a mask layer having an opening in a region in conformity with a desired shape of p+ region 18 is formed in accordance with a procedure similar to the steps (S30) and (S40), and using this mask layer as a mask, a p-type impurity such as Al or B is introduced in n− SiC layer 12 through ion implantation, to thereby form p+ region 18.

Referring next to FIG. 2, in a step (S60), an activation annealing step is performed. In this step (S60), activation annealing which is heat treatment for activating an impurity introduced through ion implantation above is performed by heating n− SiC layer 12 in which ions have been implanted to a temperature around 1700° C., for example, in an Ar (argon) atmosphere and holding the layer for approximately 30 minutes.

Referring next to FIG. 2, in a step (S70), a gate insulating film formation step is performed. In this step (S70), referring to FIG. 6, n+ SiC substrate 11 on which n− SiC layer 12 including a desired ion implantation region has been formed through the steps (S10) to (S60) is subjected to thermal oxidation. Thermal oxidation can be performed, for example, by heating the substrate to a temperature around 1300° C. in an oxygen atmosphere and holding the substrate for approximately 10 minutes. Thus, a thermal oxide film 15A to serve as gate oxide film 15 (see FIG. 1) composed of silicon dioxide ($SiO_2$) (for example, having a thickness of approximately 50 nm) is formed on second main surface 12B.

Referring next to FIG. 2, in steps (S80) and (S90), an ohmic electrode formation step and a drain electrode formation step are performed. Here, the steps (S80) and (S90) may be performed in this order or in the order of the steps (S90) and (S80), however, from a point of view of decrease in the number of steps, these steps are preferably simultaneously performed as will be described below. In the steps (S80) and (S90), referring to FIG. 3, initially, in steps (S81) to (S83), a Ti film formation step, an Al film formation step and an Si film formation step are performed in this order.

Figure 6:
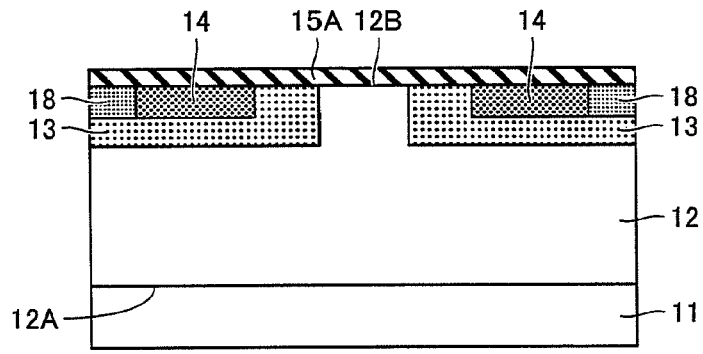
FIG. 6 is a schematic cross-sectional view for illustrating the method of manufacturing a MOSFET in the first embodiment.
Figure 7:
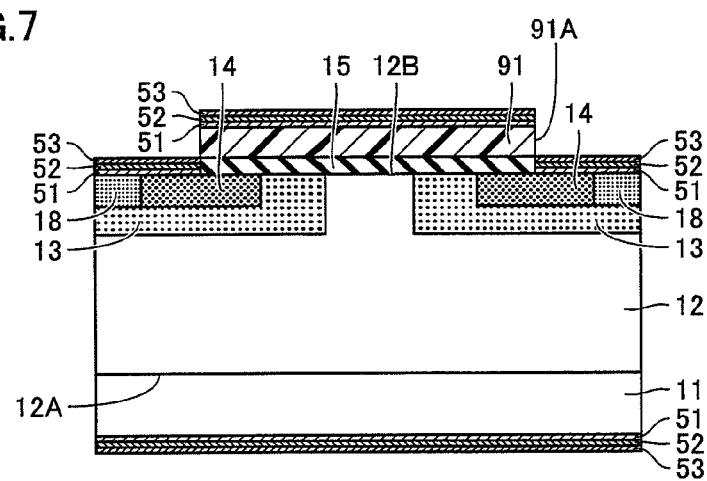
FIG. 7 is a schematic cross-sectional view for illustrating the method of manufacturing a MOSFET in the first embodiment.

Specifically, referring to FIGS. 6 and 7, initially, after a resist is applied onto thermal oxide film 15A, exposure and development are performed to thereby form a resist film 91 having an opening 91A in conformity with a region where source contact electrode 16 (see FIG. 1) is to be formed. Then, using resist film 91 as a mask, gate oxide film 15 is formed as a result of partial removal of thermal oxide film 15A, for example, through RTE. Thereafter, as shown in FIG. 7, a Ti film 51 composed of Ti, an Al film 52 composed of Al, and an Si film 53 composed of Si are formed in this order on second main surface 12B and on the main surface of n+ SiC substrate 11 opposite to n− SiC layer 12, for example, through sputtering. In addition, as a result of removal of resist film 91, Ti film 51, Al film 52 and Si film 53 on resist film 91 are removed (lifted off), so that Ti film 51, Al film 52 and Si film 53 remain on second main surface 12B exposed through thermal oxide film 15A and on the main surface of n+ SiC substrate 11 opposite to n− SiC layer 12.

Here, in the step (S81), Ti film 51 having a thickness not smaller than 100 Å and not greater than 400 Å is preferably formed. Thus, an ohmic contact electrode having low resistance in a stable manner can be formed. In addition, in the step (S82), Al layer 52 at least 1.5 times and at most 6 times as thick as the Ti layer formed in the step (S51) is preferably formed. Thus, source contact electrode 16 further reliably achieving low contact resistance with n+ source region 14 and p body 13 can be fabricated. Moreover, in the step (S83), Si film 53 having a thickness not smaller than 100 Å and not greater than 500 Å is preferably formed. Thus, an ohmic contact electrode having low resistance in a stable manner can be formed.

Figure 3:
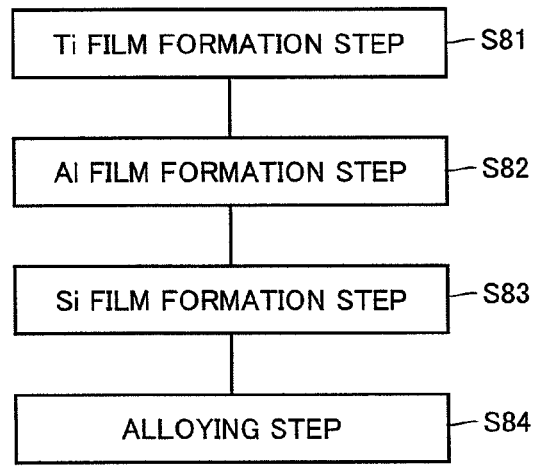
FIG. 3 is a flowchart showing details of an ohmic electrode formation step and a drain electrode formation step in FIG. 2.
Figure 8:
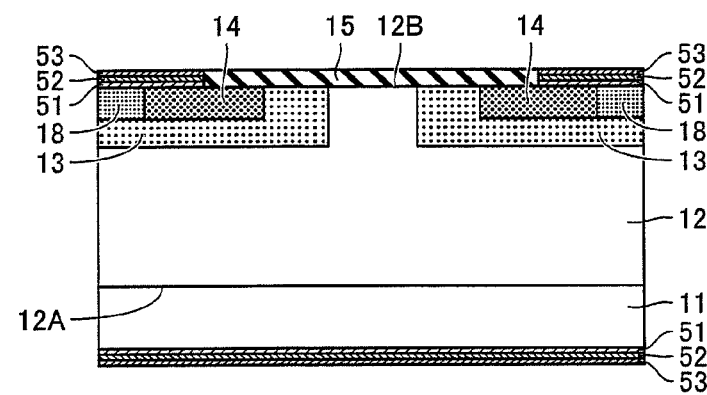
FIG. 8 is a schematic cross-sectional view for illustrating the method of manufacturing a MOSFET in the first embodiment.
Figure 9:
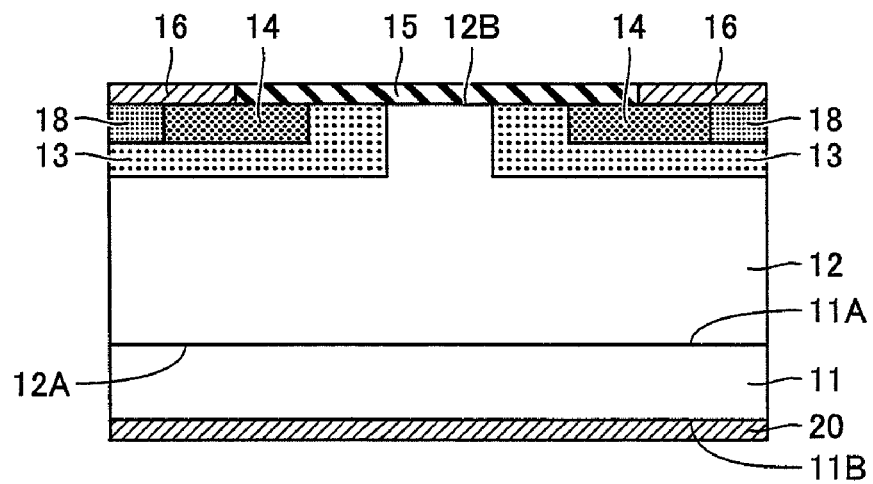
FIG. 9 is a schematic cross-sectional view for illustrating the method of manufacturing a MOSFET in the first embodiment.

Referring next to FIG. 3, in a step (S84), an alloying step is performed. Specifically, referring to FIGS. 8 and 9, n+ SiC substrate 11 for which the procedure above has been completed is heated to a temperature not lower than 550° C. and not higher than 1200° C., preferably not lower than 900° C. and not higher than 1100° C., for example 1000° C., in an atmosphere of an inert gas such as Ar and held for a time period not longer than 10 minutes, for example, 2 minutes. Thus, Ti, Al and Si contained in Ti film 51, Al film 52 and Si film 53 respectively as well as C contained in n− SiC layer 12 or n+ SiC substrate 11 are alloyed. Consequently, as shown in FIG. 9, source contact electrode 16 arranged in contact with second main surface 12B, extending from the pair of n+ source regions 14 in a direction away from gate oxide film 15 to p+ region 18 and drain electrode 20 arranged in contact with the other main surface 11B of n+ SiC substrate 11, which is the main surface opposite to one main surface 11A which is the main surface on the side where n− SiC layer 12 is formed, are formed. Here, in the step (S84), n+ SiC substrate 11 is preferably heated in a gas mixture of an inert gas, in particular, Ar and/or $N_2$, and hydrogen. Thus, source contact electrode 16, with its contact resistance with n+ source region 14 and p body 13 (p+ region 18) being further reliably lowered and manufacturing cost being suppressed, can be fabricated. The steps (S80) and (S90) are completed in the procedure above.

Referring next to FIG. 2, in a step (S100), a gate electrode formation step is performed. In this step (S100), gate electrode 17 (see FIG. 1) composed of a conductor such as polysilicon or Al is formed to be in contact with gate oxide film 15 and to extend from one n+ source region 14 to the other n+ source region 14 over the same. In an example where polysilicon is adopted as a material for a gate electrode, polysilicon can contain P at high concentration exceeding $1 \times 10^{20}$ $cm^{-3}$.

Referring next to FIG. 2, in a step (S110), a source interconnection formation step is performed. In this step (S110), source interconnection 19 (see FIG. 1) composed of a conductor such as Al is formed on the upper surface of source contact electrode 16, for example, with a vapor deposition method. Source electrode 22 (see FIG. 1) is completed in the step (S80) described above and this step (S110).

Referring next to FIG. 2, in a step (S120), a passivation film formation step is performed. In this step (S120), referring to FIG. 1, this passivation film 21 composed, for example, of $SiO_2$, is formed to extend from one source interconnection 19 over gate electrode 17 to the other source interconnection 19. This passivation film 21 can be formed, for example, with a CVD method. The method of manufacturing MOSFET 1 representing a semiconductor device in the first embodiment is completed through the steps (S10) to (S120) above and MOSFET 1 (see FIG. 1) in the first embodiment is completed.

According to the method of manufacturing a MOSFET in the first embodiment, above-described source contact electrode 16 that can be in contact with any of p+ region 18 and n− source region 14 with contact resistance being sufficiently suppressed can be formed to extend from the region in contact with the n-type region to the region in contact with the p-type region and drain electrode 20 made of a material the same as that for source contact electrode 16 can be formed simultaneously therewith. Consequently, decrease in the number of steps in the process for manufacturing MOSFET 1 and improvement in integration of MOSFET 1 can be achieved.

Second Embodiment

Figure 10:
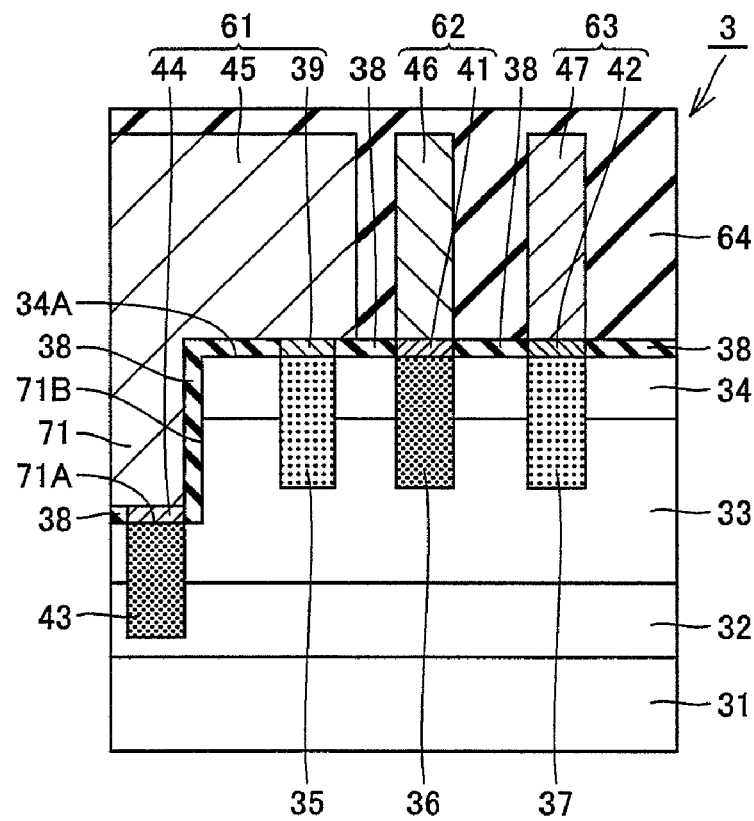
FIG. 10 is a schematic cross-sectional view showing a structure of a JFET in a second embodiment.

A second embodiment representing another embodiment of the present invention will now be described. Referring to FIG. 10, a JFET 3 which is a junction field effect transistor representing a semiconductor device in the second embodiment is the same as MOSFET 1 in the first embodiment in a structure of an ohmic contact electrode and achieves similar effects. Specifically, JFET 3 includes an n-type substrate 31 composed of SiC and having the n conductivity type, a first p-type layer 32 formed on n-type substrate 31, an n-type layer 33 formed on first p-type layer 32, and a second p-type layer 34 formed on n-type layer 33. Here, the p-type layer and the n-type layer are layers composed of SiC and having the p and n conductivity types, respectively. In addition, for example, first p-type layer 32 can have a thickness of approximately 10 μm and concentration of a p-type impurity of approximately $7.5×10^{15}$ cm$^{-3}$. For example, n-type layer 33 can have a thickness of approximately 0.45 μm and concentration of an n-type impurity of approximately $2×10^{17}$ cm$^{-3}$. For example, second p-type layer 34 can have a thickness of approximately 0.25 μm and concentration of a p-type impurity of approximately $2×10^{17}$ cm$^{-3}$.

In second p-type layer 34 and n-type layer 33, a first n-type region 35 and a second n-type region 37 containing an impurity having the n conductivity type (the n-type impurity) at concentration higher than in n-type layer 33 (for example, approximately $1×10^{20}$ cm$^{-3}$) are formed, and a first p-type region 36 containing an impurity having the p conductivity type (the p-type impurity) at concentration higher than in first p-type layer 32 and second p-type layer 34 (for example, approximately $1×10^{18}$ cm$^{-3}$) is formed such that it lies between first n-type region 35 and second n-type region 37. Namely, first n-type region 35, first p-type region 36 and second n-type region 37 are formed to reach n-type layer 33 through second p-type layer 34. In addition, a bottom portion of each of first n-type region 35, first p-type region 36 and second n-type region 37 is arranged at a distance from an upper surface of first p-type layer 32 (a boundary portion between first p-type layer 32 and n-type layer 33).

On the side opposite to first p-type region 36 when viewed from first n-type region 35, a groove portion 71 is formed to extend from an upper surface 34A of second p-type layer 34 (a main surface opposite to the n-type layer 33 side) through second p-type layer 34 to reach n-type layer 33. Namely, a bottom wall 71A of groove portion 71 is located inside n-type layer 33, at a distance from an interface between first p-type layer 32 and n-type layer 33. In addition, a second p-type region 43 containing a p-type impurity at concentration higher than in first p-type layer 32 and second p-type layer 34 (for example, approximately $1×10^{18}$ cm$^{-3}$) is formed to extend from bottom wall 71A of groove portion 71 through n-type layer 33 to reach first p-type layer 32. A bottom portion of this second p-type region 43 is arranged at a distance from an upper surface of n-type substrate 31 (a boundary portion between n-type substrate 31 and first p-type layer 32).

In addition, a source contact electrode 39, a gate contact electrode 41, a drain contact electrode 42, and a potential-holding contact electrode 44 serving as ohmic contact electrodes are formed in contact with upper surfaces of first n-type region 35, first p-type region 36, second n-type region 37, and second p-type region 43, respectively. Source contact electrode 39, gate contact electrode 41, drain contact electrode 42, and potential-holding contact electrode 44 contain Ti, Al and Si. More specifically, source contact electrode 39, gate contact electrode 41, drain contact electrode 42, and potential-holding contact electrode 44 contain Ti, Al, Si, and C as well as a remaining impurity, as in source contact electrode 16 in the first embodiment.

In addition, an oxide film 38 is formed between each of source contact electrode 39, gate contact electrode 41, drain contact electrode 42, and potential-holding contact electrode 44 serving as ohmic contact electrodes and adjacent another ohmic contact electrode. More specifically, oxide film 38 serving as an insulating film is formed on upper surface 34A of second p-type layer 34 and on bottom wall 71A and a sidewall 71B of groove portion 71, so as to cover the entire region other than regions where source contact electrode 39, gate contact electrode 41, drain contact electrode 42, and potential-holding contact electrode 44 are formed. Adjacent ohmic contact electrodes are thus isolated from each other.

Further, a source interconnection 45, a gate interconnection 46 and a drain interconnection 47 are formed to be in contact with the upper surfaces of source contact electrode 39, gate contact electrode 41 and drain contact electrode 42, respectively, and they are electrically connected to the ohmic contact electrodes. Source interconnection 45 is also in contact with an upper surface of potential-holding contact electrode 44, and hence it is also electrically connected to potential-holding contact electrode 44. Namely, source interconnection 45 is formed to extend from the upper surface of source contact electrode 39 to the upper surface of potential-holding contact electrode 44, and thus potential-holding contact electrode 44 is held at a potential as high as source contact electrode 39. Source interconnection 45, gate interconnection 46 and drain interconnection 47 are made of a conductor such as Al. Source contact electrode 39 and source interconnection 45 constitute a source electrode 61, gate contact electrode 41 and gate interconnection 46 constitute a gate electrode 62, and drain contact electrode 42 and drain interconnection 47 constitute a drain electrode 63. Furthermore, a passivation film 64 is formed to cover upper surfaces of source electrode 61, gate electrode 62, drain electrode 63, and oxide film 38. This passivation film 64 is made, for example, of SiO$_2$, and it has a function to electrically isolate source electrode 61, gate electrode 62 and drain electrode 63 from the outside and to protect JFET 3.

Namely, JFET 3 in the present embodiment includes n-type substrate 31, first p-type layer 32, n-type layer 33 and second p-type layer 34 serving as the SiC layer formed on n-type substrate 31 and composed of silicon carbide, and source electrode 61, gate electrode 62 and drain electrode 63 arranged in contact with second p-type layer 34. In addition, the SiC layer constituted of first p-type layer 32, n-type layer 33 and second p-type layer 34 includes first n-type region 35 and second n-type region 37 each of which is the n-type region having the n conductivity type and first p-type region 36 and second p-type region 43 each of which is the p-type region having the p conductivity type. In addition, source electrode 61 and drain electrode 63 include source contact electrode 39 and drain contact electrode 42 serving as the ohmic contact electrodes, that are arranged in contact with first n-type region 35 and second n-type region 37 respectively and contain Ti, Al and Si. Moreover, gate electrode 62 serving as another electrode includes gate contact electrode 41 serving as another ohmic contact electrode arranged in contact with first p-type region 36 serving as the p-type region, made of a material the same as that for source contact electrode 39 and drain contact electrode 42, and containing Ti, Al and Si.

In JFET 3 in the present embodiment, source contact electrode 39 and drain contact electrode 42 containing Ti, Al and Si as in source contact electrode 16 in the first embodiment are in contact with first n-type region 35 and second n-type region 37 each of which is an n-type region, and gate contact electrode 41 made of a material the same as that for source contact electrode 39 and drain contact electrode 42 is arranged in contact with first p-type region 36 which is a p-type region. Thus, JFET 3 is a semiconductor device capable of achieving decrease in the number of steps in a manufacturing process and improvement in integration.

More specifically, in JFET 3 in the present embodiment, in an example where Ni is used as a material for forming source contact electrode 39 and drain contact electrode 42 arranged in contact with first n-type region 35 and second n-type region 37 respectively and Ti/Al is used as a material for forming gate contact electrode 41 arranged in contact with first p-type region 36 as in a conventional JFET, the following problem arises. Namely, in a method of manufacturing JFET 3 adopting the structure above, after a mask for forming source contact electrode 39 and drain contact electrode 42 is formed, these electrodes are formed with vapor deposition or the like. Thereafter, after the mask is removed, it is necessary to further form a mask for forming gate contact electrode 41 and to form this electrode with vapor deposition or the like. If such a manufacturing process is adopted, the number of steps increases and improvement in integration is interfered because of registration error in forming masks twice. In contrast, in JFET 3 in the present embodiment, since source contact electrode 39, gate contact electrode 41 and drain contact electrode 42 can be formed with the same material, these electrodes can collectively be formed by forming a mask once. Consequently, JFET 3 in the present embodiment can achieve decrease in the number of steps in a manufacturing process and improvement in integration.

An operation of JFET 3 will now be described. Referring to FIG. 10, while a voltage of gate electrode 62 is set to 0V, in n-type layer 33, a region lying between first p-type region 36 and second n-type region 37 and a region lying between the former region and first p-type layer 32 (a drift region) as well as a region lying between first p-type region 36 and first p-type layer 32 (a channel region) are not depleted, and hence first n-type region 35 and second n-type region 37 are electrically connected to each other through n-type layer 33. Therefore, electrons migrate from first n-type region 35 toward second n-type region 37, whereby a current flows.

Meanwhile, as a voltage increasing in a negative direction is applied to gate contact electrode 41, depletion of the channel region and the drift region described above proceeds and first n-type region 35 and second n-type region 37 are electrically disconnected from each other. Therefore, electrons cannot migrate from first n-type region 35 toward second n-type region 37, whereby no current flows.

Figure 11:
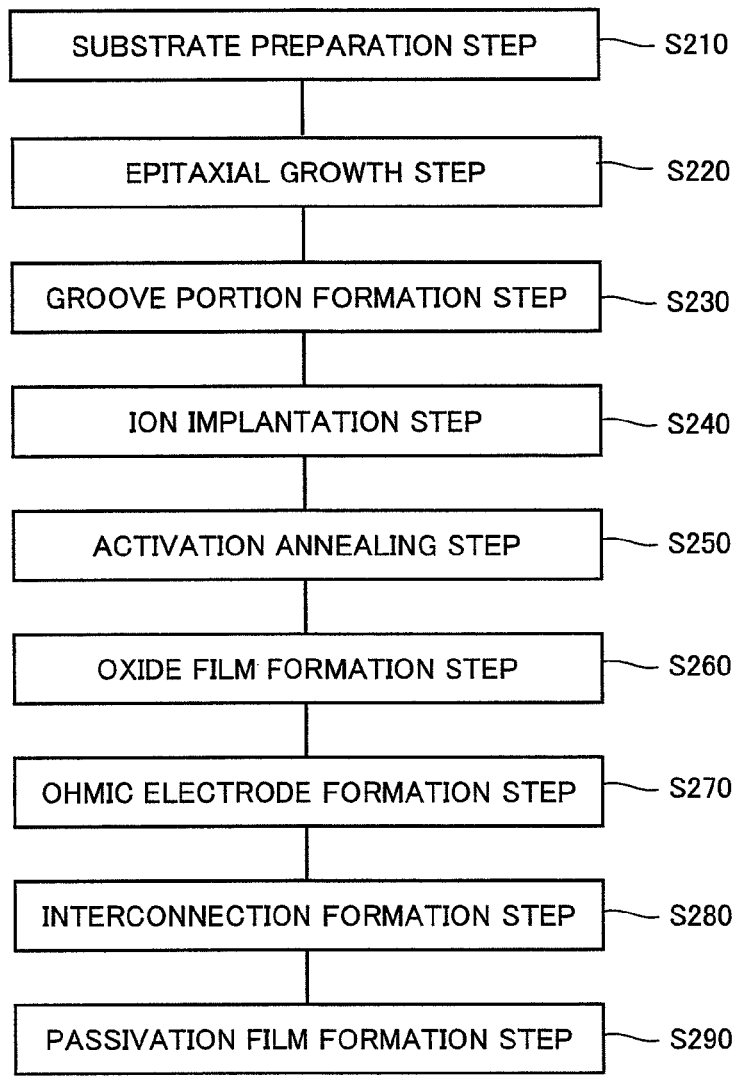
FIG. 11 is a flowchart showing outlines of a method of manufacturing a JFET representing a semiconductor device in the second embodiment.
Figure 13:
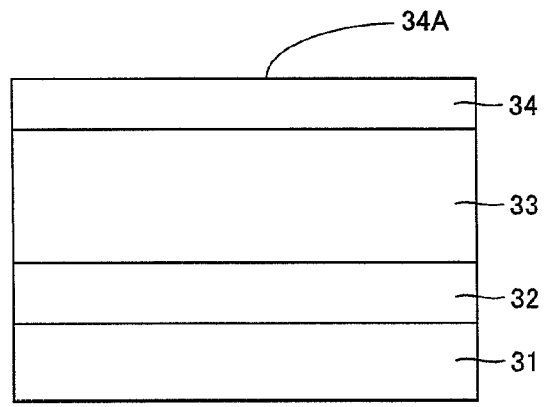
FIG. 13 is a schematic cross-sectional view for illustrating a method of manufacturing a JFET in the second embodiment.

A method of manufacturing JFET 3 representing a semiconductor device in the second embodiment will now be described. Referring to FIG. 11, in the method of manufacturing JFET 3 in the present embodiment, initially, in a step (S210), a substrate preparation step is performed. Specifically, in the step (S210), as shown in FIG. 13, n-type substrate 31 containing an n-type impurity at high concentration and composed of SiC is prepared. Thereafter, in a step (S220), an epitaxial growth step is performed. Specifically, first p-type layer 32, n-type layer 33 and second p-type layer 34 composed of SiC are successively formed on one main surface of n-type substrate 31, for example, through vapor-phase epitaxial growth. In vapor-phase epitaxial growth, for example, a silane ($SiH_4$) gas and a propane ($C_3H_8$) gas can be used as a source gas, and a hydrogen ($H_2$) gas can be adopted as a carrier gas. In addition, for example, diborane ($B_2H_6$) or trimethylaluminum (TMA) can be adopted as a p-type impurity source for forming a p-type layer, and for example, nitrogen ($N_2$) can be adopted as an n-type impurity for forming an n-type layer. Thus, first p-type layer 32 and second p-type layer 34 containing a p-type impurity such as Al or B and n-type layer 33 containing an n-type impurity such as N are formed.

Figure 14:
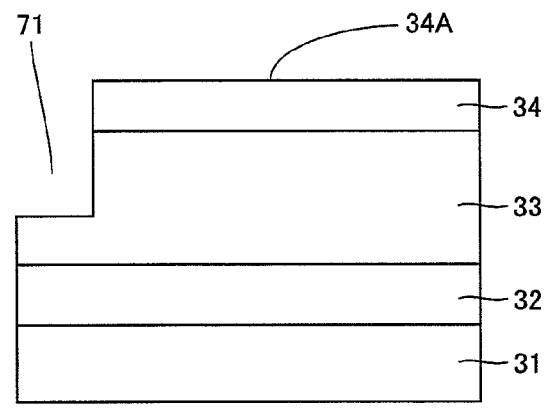
FIG. 14 is a schematic cross-sectional view for illustrating the method of manufacturing a JFET in the second embodiment.

Referring next to FIG. 11, in a step (S230), a groove portion formation step is performed. Specifically, in the step (S230), as shown in FIG. 14, groove portion 71 is formed to extend from upper surface 34A of second p-type layer 34 through second p-type layer 34 to reach n-type layer 33. Groove portion 71 can be formed in such a manner that, for example, a mask layer having an opening at a desired position where groove portion 71 is to be formed is formed on upper surface 34A of second p-type layer 34 and thereafter dry etching using $SF_6$ gas is performed.

Figure 15:
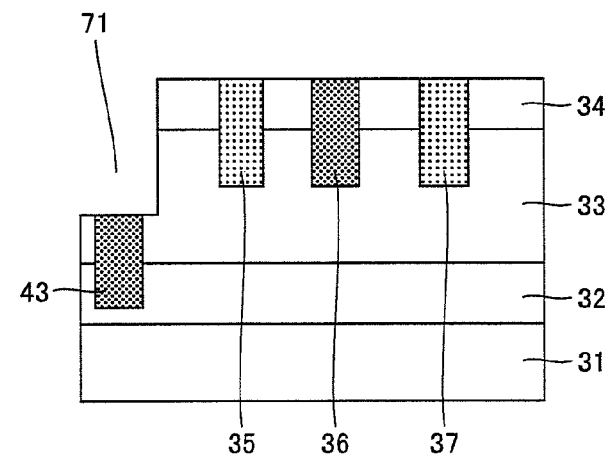
FIG. 15 is a schematic cross-sectional view for illustrating the method of manufacturing a JFET in the second embodiment.

Referring next to FIG. 11, in a step (S240), an ion implantation step is performed. Specifically, in the step (S240), referring to FIGS. 14 and 15, initially, an oxide film composed of $SiO_2$ is formed on upper surface 34A of second p-type layer 34 and on the bottom wall of groove portion 71, for example, with CVD. Then, after a resist is applied onto the oxide film, exposure and development are performed to thereby form a resist film having openings in regions in conformity with desired shapes of first n-type region 35 and second n-type region 37. Then, using the resist film as a mask, the oxide film is partially removed, for example, through RIE, and a mask layer formed of the oxide film having an opening pattern is formed on upper surface 34A of second p-type layer 34. Thereafter, the resist film above is removed, and using this mask layer as a mask, ion implantation in n-type layer 33 and second p-type layer 34 is performed. A type of ions to be implanted includes, for example, P, N and the like. First n-type region 35 and second n-type region 37 reaching n-type layer 33 through second p-type layer 34 are thus formed.

In addition, after the mask layer used for forming first n-type region 35 and second n-type region 37 is removed, in accordance with a similar procedure, a mask layer having openings in regions in conformity with desired shapes of first p-type region 36 and second p-type region 43 is formed on upper surface 34A of second p-type layer 34 and on the bottom wall of groove portion 71. Then, using this mask layer as a mask, ion implantation in first p-type layer 32, n-type layer 33 and second p-type layer 34 is performed. A type of ions to be implanted includes, for example, Al, B and the like. First p-type region 36 reaching n-type layer 33 through second p-type layer 34 and second p-type region 43 reaching first p-type layer 32 through n-type layer 33 from bottom wall 71A of groove portion 71 are thus formed.

Referring next to FIG. 11, in a step (S250), an activation annealing step is performed. Specifically, in the step (S250), n-type substrate 31 having first p-type layer 32, n-type layer 33 and second p-type layer 34 in which ion implantation above has been completed is subjected to activation annealing in such a manner that n-type substrate 31 is heated to 1700° C. in an atmosphere of an inert gas such as argon and held for 30 minutes. Thus, an impurity such as P or Al introduced in the step (S240) is activated and it can function as the n-type impurity or the p-type impurity.

Figure 16:
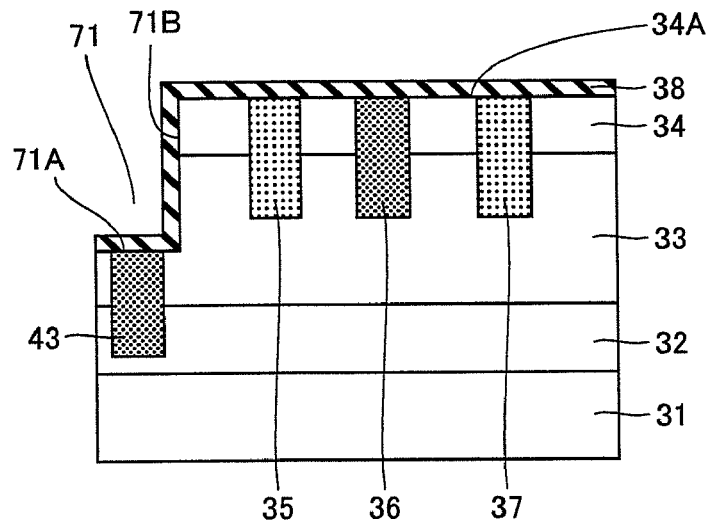
FIG. 16 is a schematic cross-sectional view for illustrating the method of manufacturing a JFET in the second embodiment.

Referring next to FIG. 11, in a step (S260), an oxide film formation step is performed. Specifically, in the step (S260), referring to FIG. 16, thermal oxidation treatment, for example, in which heating to a temperature around 1300° C. in an oxygen atmosphere and holding for approximately 30 minutes is carried out, is performed so that oxide film 38 serving as an insulating film (a field oxide film) covering upper surface 34A of second p-type layer 34 as well as bottom wall 71A and sidewall 71B of groove portion 71 is formed. Oxide film 38 has a thickness, for example, of approximately 0.1 μm.

Figure 17:
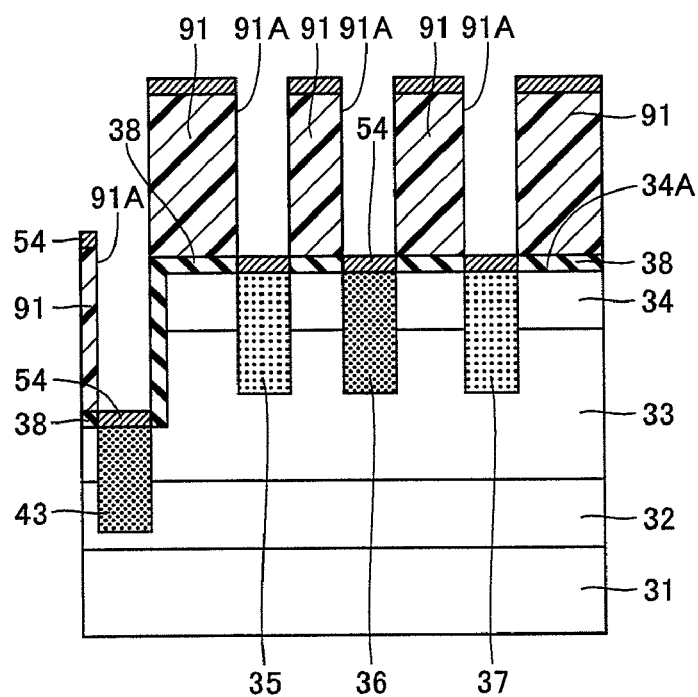
FIG. 17 is a schematic cross-sectional view for illustrating the method of manufacturing a JFET in the second embodiment.

Referring next to FIG. 11, in a step (S270), an ohmic electrode formation step is performed. In the step (S270), referring to FIG. 12, initially, a mixture film formation step is performed as a step (S271). Specifically, referring to FIG. 17, initially, after a resist is applied onto oxide film 38, exposure and development are performed to thereby form resist film 91 having opening 91A in conformity with regions where source contact electrode 39, gate contact electrode 41, drain contact electrode 42, and potential-holding contact electrode 44 (see FIG. 10) are to be formed. Then, using resist film 91 as a mask, thermal oxide film 15A is partially removed, for example, through RIE. Thereafter, mixture film 54 containing Ti, Al and Si is formed on resist film 91 and in a region exposed through resist film 91 through mixed sputtering in which simultaneous sputtering, for example, with Ti, Al and Si is performed. In addition, as a result of removal of resist film 91, mixture film 54 on resist film 91 is removed (lifted off), so that mixture film 54 remains in contact with first n-type region 35, first p-type region 36, second n-type region 37, and second p-type region 43.

Here, in the step (S271), mixture film 54 containing Al at least 1.58 times and at most 6.33 times as much as Ti in terms of an atomic ratio is preferably formed. Thus, contact resistance between source contact electrode 39 and first n-type region 35, contact resistance between drain contact electrode 42 and second n-type region 37, and contact resistance between gate contact electrode 41 and first p-type region 36 can more reliably be lowered.

Figure 12:
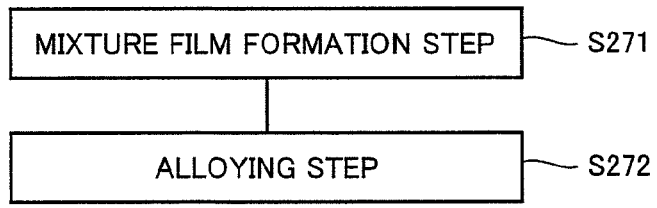
FIG. 12 is a flowchart showing details of an ohmic electrode formation step in FIG. 11.
Figure 18:
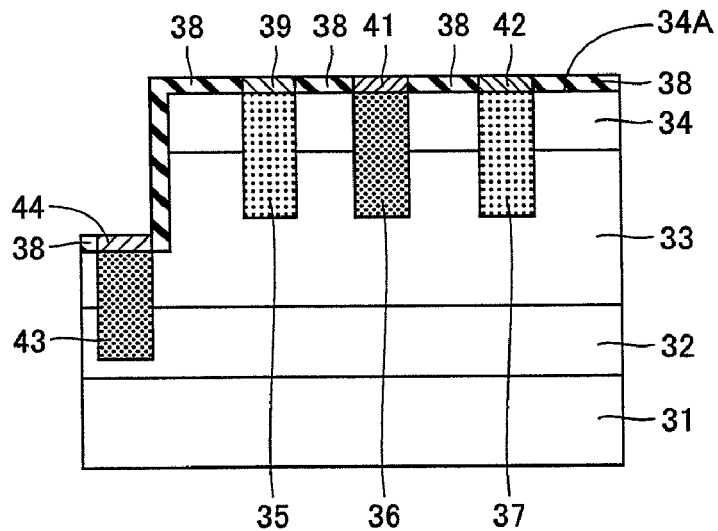
FIG. 18 is a schematic cross-sectional view for illustrating the method of manufacturing a JFET in the second embodiment.

Referring next to FIG. 12, in a step (S272), an alloying step is performed. Specifically, referring to FIG. 18, alloying treatment in which heating to a temperature not lower than 550° C. and not higher than 1200° C., preferably not lower than 900° C. and not higher than 1100° C., for example 1000° C., in an atmosphere of an inert gas such as Ar is carried out and holding for a time period not longer than 10 minutes, for example, 2 minutes, is carried out, is performed. Thus, Ti, Al and Si contained in mixture film 54 as well as C contained in n-type layer 33 or second p-type layer 34 are alloyed. Consequently, as shown in FIG. 18, source contact electrode 39, gate contact electrode 41, drain contact electrode 42, and potential-holding contact electrode 44 serving as the ohmic contact electrodes are formed in contact with the upper surfaces of first n-type region 35, first p-type region 36, second n-type region 37, and second p-type region 43 respectively. Here, in the step (S84), heating above is preferably performed in a gas mixture of an inert gas, in particular, Ar and/or $N_2$, and hydrogen. Thus, source contact electrode 39, gate contact electrode 41 and drain contact electrode 42 can be fabricated with manufacturing cost being suppressed and contact resistance being suppressed. The step (S270) is completed in the procedure above.

Referring next to FIG. 11, in a step (S280), an interconnection formation step is performed. Specifically, in the step (S280), referring to FIG. 10, source interconnection 45, gate interconnection 46 and drain interconnection 47 in contact with the upper surfaces of source contact electrode 39, gate contact electrode 41 and drain contact electrode 42 respectively are formed. Source interconnection 45, gate interconnection 46 and drain interconnection 47 can be formed, for example, by forming a resist layer having openings in desired regions where source interconnection 45, gate interconnection 46 and drain interconnection 47 are to be formed, vapor-depositing Al, and thereafter removing (lifting off) Al on the resist layer together with the resist layer.

Referring next to FIG. 11, in a step (S290), a passivation film formation step is performed. Specifically, in the step (S290), passivation film 64 composed, for example, of $SiO_2$ is formed to cover the upper surfaces of source electrode 61, gate electrode 62, drain electrode 63, and oxide film 38. This passivation film 64 can be formed, for example, with CVD.

Through the steps above, JFET 3 in the present embodiment is completed. Here, in the method of manufacturing JFET 3 representing a semiconductor device in the present embodiment above, since source contact electrode 39, gate contact electrode 41 and drain contact electrode 42 can be formed with the same material containing Ti, Al and Si, these electrodes can simultaneously be formed by forming a mask once. Consequently, the method of manufacturing JFET 3 in the present embodiment can achieve decrease in the number of steps in a manufacturing process and improvement in integration.

In the embodiment above, in manufacturing a MOSFET, an ohmic contact electrode is formed by forming the Ti film, the Al film and Si film and thereafter alloying the same, and in manufacturing a JFET, an ohmic contact electrode is formed in the steps of forming a mixture film and thereafter alloying this mixture film, however, the method of manufacturing a semiconductor device in the present invention is not limited thereto. In the method of manufacturing a semiconductor device according to the present invention, an ohmic contact electrode can be formed with various methods, including the two methods above.

In addition, in the embodiments above, a MOSFET and a JFET have been described by way of example of a semiconductor device according to the present invention, however, a semiconductor device according to the present invention is not limited thereto and other semiconductor devices such as an IGBT (Insulated Gate Bipolar Transistor) and a bipolar transistor are also applicable.

Third Embodiment

A third embodiment representing yet another embodiment of the present invention will now be described. A semiconductor device in the third embodiment is basically structured similarly to MOSFET 1 representing the semiconductor device in the first embodiment, achieves similar effects, and can be manufactured similarly. A method of manufacturing MOSFET 1 in the third embodiment is different from that in the first embodiment in an ohmic electrode formation step and a drain electrode formation step (see FIG. 2).

Figure 19:
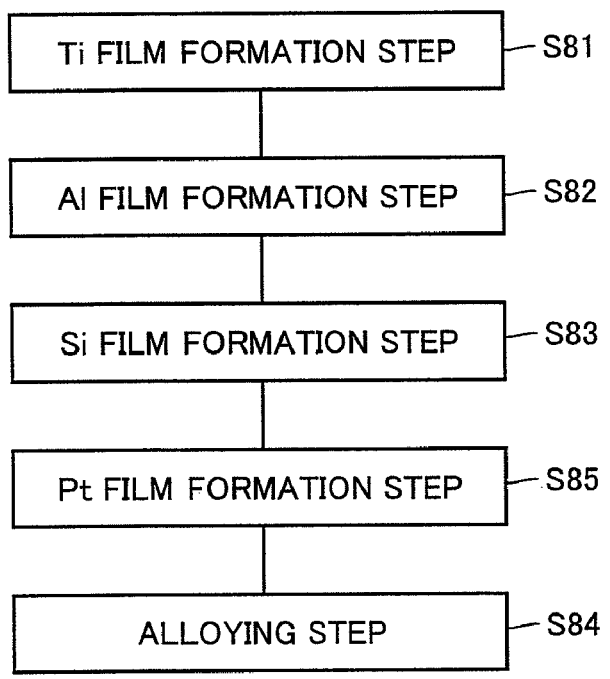
FIG. 19 is a flowchart showing details of an ohmic electrode formation step and a drain electrode formation step in a third embodiment.
Figure 20:
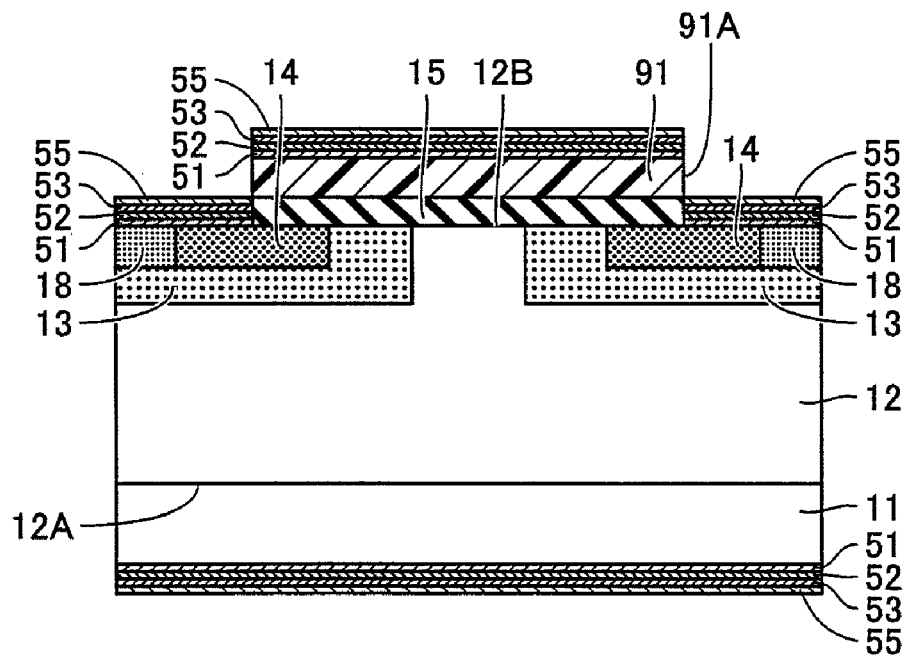
FIG. 20 is a schematic cross-sectional view for illustrating a method of manufacturing a MOSFET in the third embodiment.
Figure 21:
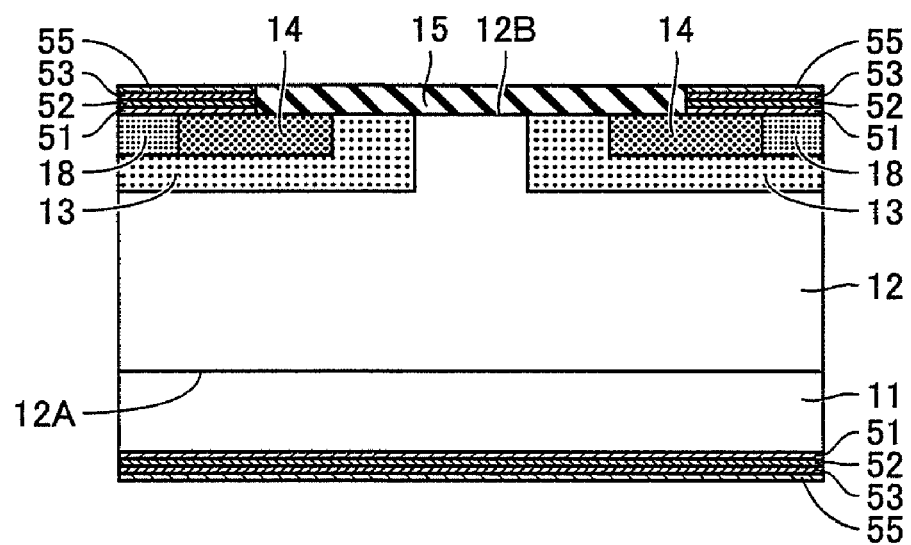
FIG. 21 is a schematic cross-sectional view for illustrating the method of manufacturing a MOSFET in the third embodiment.

Namely, referring to FIGS. 19, 2 and 3, an ohmic contact electrode formation step (S80) in the third embodiment is different from that in the first embodiment in that a Pt film formation step is performed as a step (S85) after the Si film formation step (S83) and before the alloying step (S84). Specifically, in the ohmic electrode formation step (S80) and the drain electrode formation step (S90) in the third embodiment, initially, the steps (S81) to (S83) are performed as in the first embodiment. Then, in the step (S85), as shown in FIG. 20, a Pt film 55 composed of platinum is further formed on Si film 53 formed in the step (S83). This Pt film 55 can be formed, for example, through sputtering, as in the case of Ti film 51 and the like. Then, referring to FIG. 21, as in the first embodiment, Ti film 51, Al film 52, Si film 53, and Pt film 55 on resist film 91 are removed (lifted off) as a result of removal of resist film 91, and Ti film 51, Al film 52, Si film 53, and Pt film 55 remain on second main surface 12B exposed through thermal oxide film 15A and on the main surface of $n^+$ SiC substrate 11 opposite to $n^-$ SiC layer 12. Thereafter, as the process similar to that in the first embodiment is performed, the method of manufacturing MOSFET 1 in the third embodiment is completed.

By forming Pt film 55 further on Si film 53 and then performing the alloying step (S84) as in the present embodiment, oxidation of Ti film 51 and Al film 52 in the step (S84) is further suppressed, so that source contact electrode 16 and drain electrode 20 achieving further lowered contact resistance can be fabricated in a stable manner.

Fourth Embodiment

A fourth embodiment representing yet another embodiment of the present invention will now be described. A semiconductor device in the fourth embodiment is basically structured similarly to JFET 3 representing the semiconductor device in the second embodiment, achieves similar effects, and can be manufactured similarly. A method of manufacturing JFET 3 in the fourth embodiment is different from that in the second embodiment in an ohmic electrode formation step (see FIG. 11).

Figure 22:
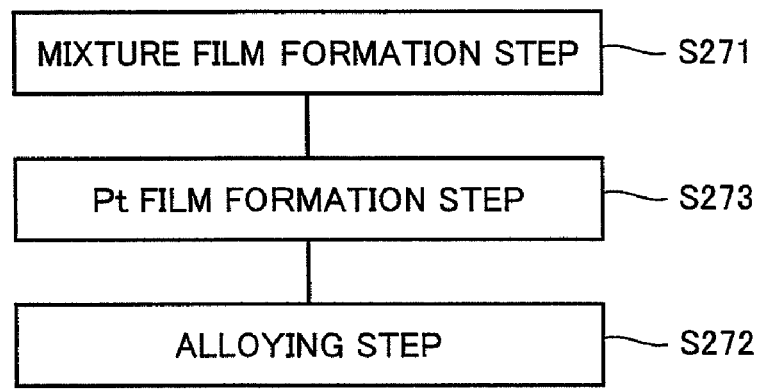
FIG. 22 is a flowchart showing details of an ohmic electrode formation step in a fourth embodiment.
Figure 23:
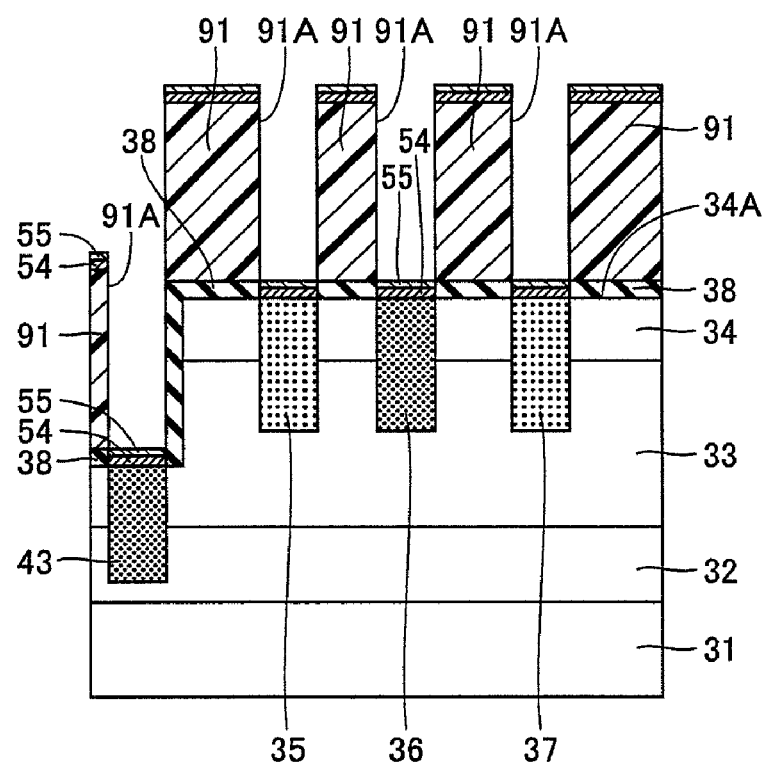
FIG. 23 is a schematic cross-sectional view for illustrating a method of manufacturing a JFET in the fourth embodiment.

Namely, referring to FIGS. 22, 11 and 12, an ohmic contact electrode formation step (S270) in the fourth embodiment is different from that in the second embodiment in that a Pt film formation step is performed as a step (S273) after the mixture film formation step (S271) and before the alloying step (S272). Specifically, in the ohmic electrode formation step (S270) in the fourth embodiment, initially, the step (S271) is performed as in the second embodiment. Then, in the step (S273), as shown in FIG. 23, Pt film 55 composed of platinum is further formed on mixture film 54 formed in the step (S271). This Pt film 55 can be formed, for example, through sputtering. Then, as in the first embodiment, mixture film 54 and Pt film 55 on resist film 91 are removed (lifted off) as a result of removal of resist film 91, and mixture film 54 and Pt film 55 remain on first n-type region 35, first p-type region 36, second n-type region 37, and second p-type region 43. Thereafter, as the process similar to that in the second embodiment is performed, the method of manufacturing JFET 3 in the fourth embodiment is completed.

By forming Pt film 55 further on mixture film 54 and then performing the alloying step (S272) as in the present embodiment, oxidation of Ti and Al in the step (S272) is further suppressed, so that source contact electrode 39, gate contact electrode 41 and drain contact electrode 42 achieving further lowered contact resistance can be fabricated in a stable manner.

Example 1

Example 1 of the present invention will be described hereinafter. An experiment was conducted for comparing contact resistance between an ohmic contact electrode containing Ti, Al and Si included in the semiconductor device according to the present invention (TiAlSi; Example) and the SiC layer with contact resistance between Ni and Ti/Al (Comparative Examples) representing conventional ohmic contact electrodes out of the scope of the present invention and the SiC layer. A procedure in the experiment is as follows.

Initially, an SiC substrate was prepared, and an n-type SiC region containing P (phosphorus) representing an n-type impurity at concentration of $6 \times 10^{19}$ cm$^{-3}$ and a p-type SiC region containing Al (aluminum) representing a p-type impurity at concentration of $5 \times 10^{19}$ cm$^{-3}$ were formed in the SiC substrate through ion implantation. Then, an ohmic contact electrode containing Ti, Al and Si was formed to be in contact with the n-type SiC region and the p-type SiC region with a method similar to that in the first embodiment above and contact resistivity was measured (Example). For comparison, an electrode composed of Ni and an electrode composed of Ti/Al were also formed to be in contact with the n-type SiC region and the p-type SiC region and contact resistivity was measured (Comparative Examples). Results of measurement are shown in Table 1.

TABLE 1

| | Contact Resistivity with n-Type SiC Region ($\Omega \cdot cm^2$) | Contact Resistivity with p-Type SiC Region ($\Omega \cdot cm^2$) |
|---|---|---|
| NiSi (Comparative Example) | $5 \times 10^{-6}$ | $2 \times 10^{-2}$ |
| TiAl (Comparative Example) | $3 \times 10^{-3}$ | $2 \times 10^{-3}$ |
| TiAlSi (Example) | $7 \times 10^{-6}$ | $3 \times 10^{-3}$ |

Referring to Table 1, though the electrode composed of Ni can be in contact with the n-type SiC region at low contact resistivity of $5 \times 10^{-6} \Omega \cdot cm^2$, contact resistivity with the p-type SiC region is $2 \times 10^{-2} \Omega \cdot cm^2$, which is not sufficiently low. On the other hand, though the electrode composed of Ti/Al can be in contact with the p-type SiC region at low contact resistivity of $2 \times 10^{-3} \Omega \cdot cm^2$, contact resistivity with the n-type SiC region is $3 \times 10^{-3} \Omega \cdot cm^2$, which is not sufficiently low.

In contrast, the ohmic contact electrode (TiAlSi) containing Ti, Al and Si and included in the semiconductor device according to the present invention has contact resistance with the n-type SiC region of $7 \times 10^{-6} \Omega \cdot cm^2$, which is comparable to that of Ni and has contact resistance with the p-type SiC region of $3 \times 10^{-3} \Omega \cdot cm^2$, which is comparable to that of Ti/Al. It was thus confirmed that the ohmic contact electrode containing Ti, Al and Si and included in the semiconductor device according to the present invention can achieve sufficiently suppressed contact resistance with any of the p-type SiC region and the n-type SiC region.

Example 2

Example 2 of the present invention will be described hereinafter. An experiment was conducted for examining influence of a composition of an ohmic contact electrode on contact resistance with a p-type SiC region and an n-type SiC region, with regard to the ohmic contact electrode included in the semiconductor device according to the present invention. A procedure in the experiment is as follows.

Figure 24:
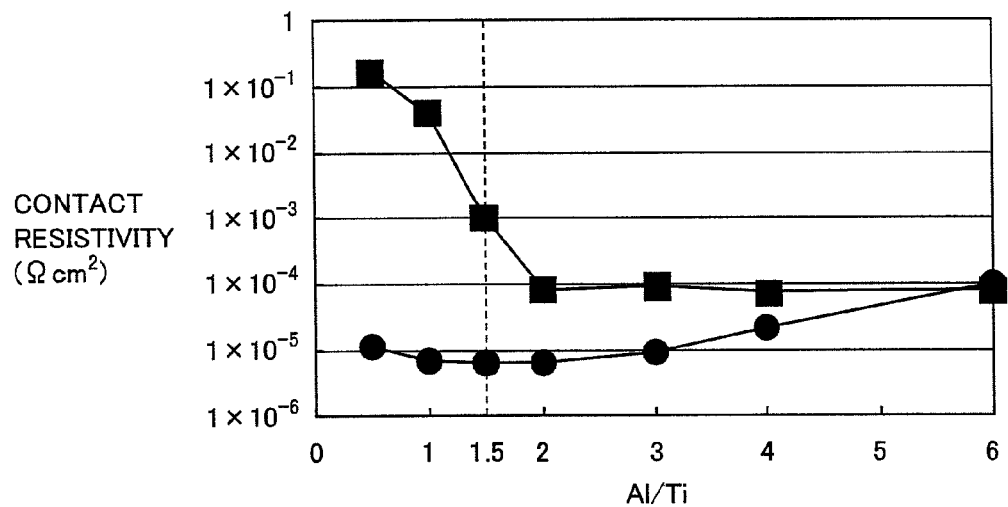
FIG. 24 is a diagram showing relation between a ratio of a film thickness of an Al layer to a Ti layer and contact resistivity.
Figure 25:
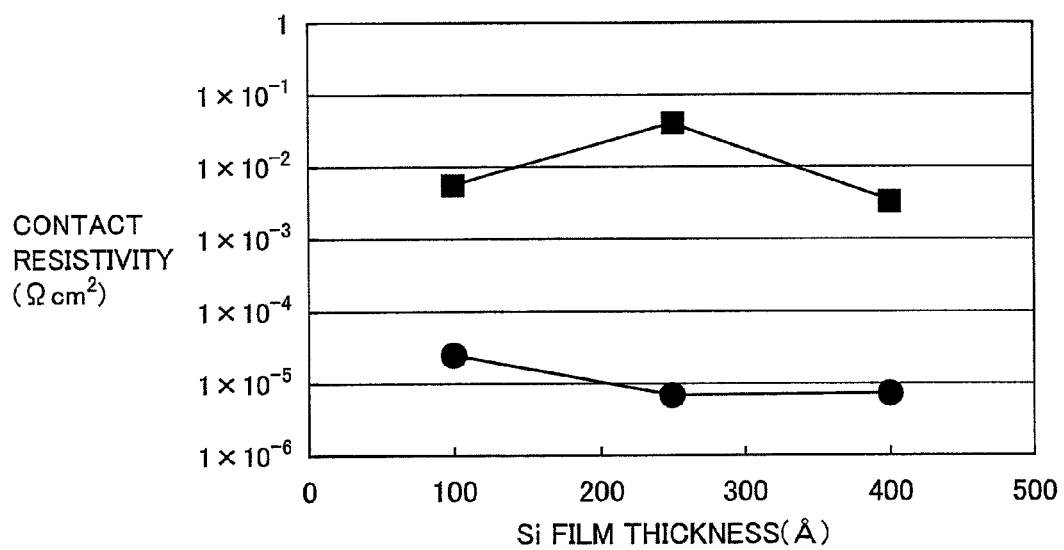
FIG. 25 is a diagram showing relation between a film thickness of an Si layer and contact resistivity.

Initially, an SiC substrate was prepared, and as in Example 1 above, an n-type SiC region containing P (phosphorus) representing an n-type impurity at concentration of $6 \times 10^{19}$ cm$^{-3}$ and a p-type SiC region containing Al (aluminum) representing a p-type impurity at concentration of $5 \times 10^{19}$ cm$^{-3}$ were formed in the SiC substrate through ion implantation. Then, an ohmic contact electrode containing Ti, Al and Si was formed to be in contact with the n-type SiC region and the p-type SiC region with a method similar to that in the first embodiment above and contact resistivity was measured. Here, an experiment in which a composition of an ohmic contact electrode was varied by varying a thickness of an Al film with a thickness of a Ti film being fixed to 200 Å and a thickness of an Si film being fixed to 250 Å (Experiment 1) and an experiment in which a composition of an ohmic contact electrode was varied by varying a thickness of an Si film with a thickness of each of a Ti film and an Al film being fixed to 200 Å (Experiment 2) were conducted. FIG. 24 shows results in Experiment 1, and FIG. 25 shows results in Experiment 2. In FIG. 24, the abscissa represents a ratio of a thickness of an Al film to a thickness of a Ti film and the ordinate represents contact resistivity. In addition, in FIG. 25, the abscissa represents a thickness of an Si film and the ordinate represents contact resistivity. In FIGS. 24 and 25, a circle represents contact resistance with the n-type SiC region and a square represents contact resistance with the p-type SiC region.

The results of the experiments will now be described. Referring to FIG. 24, it can be seen that too high a ratio of a thickness of the Al film to the Ti film leads to high contact resistance between the ohmic contact electrode and the n-type SiC region, while too low a ratio of thickness leads to high contact resistance between the ohmic contact electrode and the p-type SiC region. When the ratio of thickness above is lower than 1.5, contact resistance between the electrode and the p-type SiC region exceeds $1 \times 10^{-3} \Omega \cdot cm^2$. When the ratio of thickness above exceeds 6, contact resistance between the electrode and the n-type SiC region exceeds $1 \times 10^{-4} \Omega \cdot cm^2$.

As described above, for practical adoption as an ohmic contact electrode, preferably, contact resistance with the p-type SiC region is not higher than approximately $1 \times 10^{-3} \Omega \cdot cm^2$ and contact resistance with the n-type SiC region is not higher than approximately $1 \times 10^{-4} \Omega \cdot cm^2$. Therefore, it can be concluded from the results of the experiments above that an Al film at least 1.5 times and at most 6 times as thick as a Ti film is preferably formed in the step of forming an Al film above. It is noted that, based on the ratio of thickness above in the manufacturing process, the ohmic contact electrode preferably contains Al at least 1.58 times and at most 6.33 times as much as Ti in terms of an atomic ratio. In addition, it can be concluded from FIG. 24 that an Al film further preferably has a thickness at least two times as great as a Ti film in order to further reliably lower contact resistance with the p-type SiC region.

Meanwhile, referring to FIG. 25, it was found, from the results in Experiment 2 in which a thickness of the Si film was varied with a thickness of each of the Ti film and the Al film being fixed, that contact resistance of the ohmic contact electrode with any of the p-type SiC layer and the n-type SiC layer hardly varied even if a thickness of the Si film was varied, so long as a thickness of each of the Ti film and the Al film was constant. It became clear from the results above that contact resistance of the ohmic contact electrode can reliably be lowered, without much depending on a thickness of an Si film (a content of Si in the ohmic contact electrode), by setting a ratio of a thickness of the Al film to the Ti film (a ratio of an Al content to a Ti content in the ohmic contact electrode) to a range confirmed as preferable in Experiment 1 above.

Example 3

Example 3 of the present invention will be described hereinafter. An experiment was conducted for checking a state of formation of an ohmic contact electrode included in the semiconductor device according to the present invention. A procedure in the experiment is as follows. It is noted that the "ohmic contact electrode" in the present application refers to an electrode formed to lower contact resistance with an SiC layer by forming a metal film on the SiC layer and subjecting the metal film to heat treatment.

Initially, a sample was fabricated by forming an ohmic contact electrode on an SiC layer in accordance with a procedure similar to the steps (S81) to (S84) in the first embodiment above. Thereafter, the sample was cut in a cross-section perpendicular to a surface of the ohmic contact electrode and the cross-section was observed with an SEM (Scanning Electron Microscope) and photographed. In addition, while performing sputtering in a direction perpendicular to the surface of the ohmic contact electrode in the sample above, Auger spectroscopic analysis was conducted to examine distribution of elements around the ohmic contact electrode.

Figure 26:
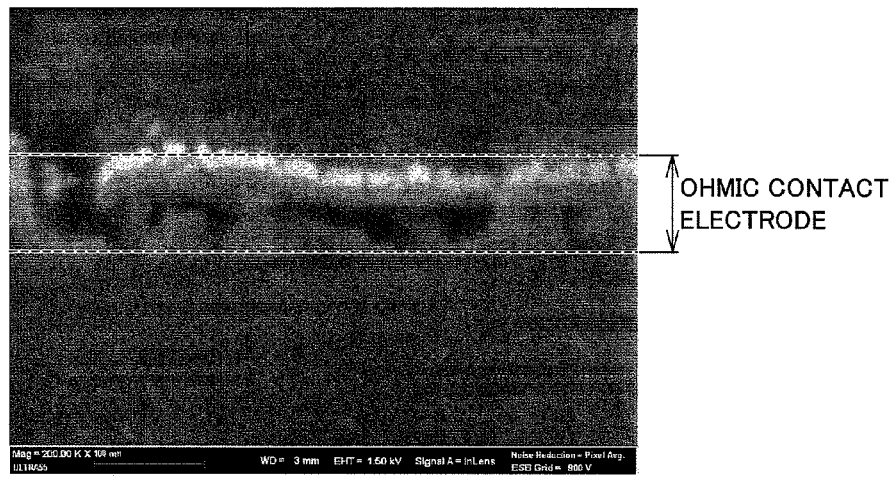
FIG. 26 is an SEM photograph of a portion around an ohmic contact electrode in Example 3

Results of the experiment will now be described with reference to FIGS. 26 and 27. Here, in FIG. 26, the upper side shows a region outside the range of the sample and the lower side shows the semiconductor layer. As shown in FIG. 26, a region different in brightness lying between these regions is the ohmic contact electrode. In addition, in FIG. 27, the abscissa represents a sputtering time period and a depth from the surface of the ohmic contact electrode, and the ordinate represents atomic concentration.

Referring to FIG. 26, it is confirmed that the ohmic contact electrode having a substantially uniform thickness was formed on the SiC layer in the sample. Here, referring to this SEM photograph, the ohmic contact electrode extends from a position where an alloy layer composed of a metal and the like appears for the first time to the surface, when viewed from the SiC layer side toward the surface side (the ohmic contact electrode side).

Figure 27:
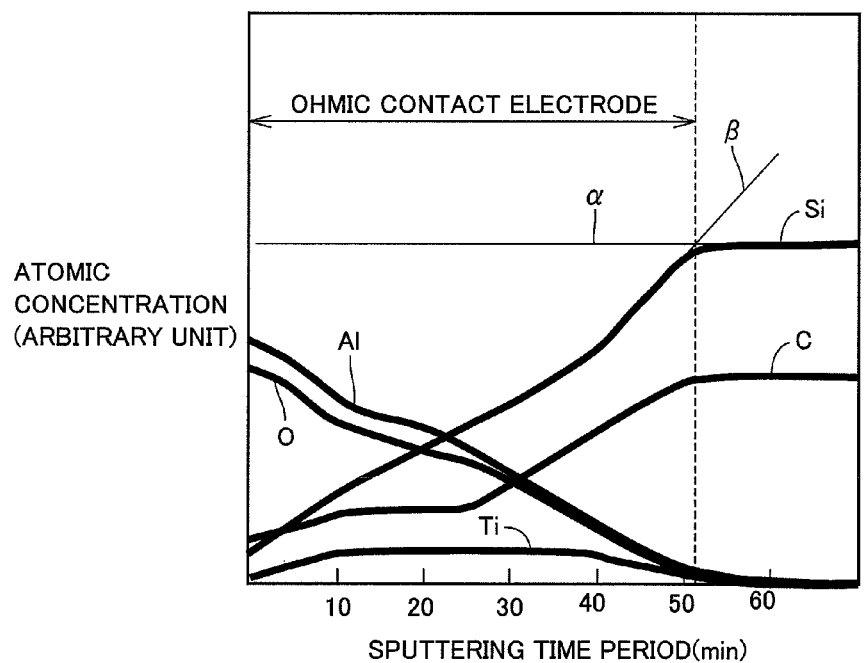
FIG. 27 is a diagram showing distribution of elements around the ohmic contact electrode in Example 3.

In addition, referring to FIG. 27, it can be seen that the ohmic contact electrode included in the sample above is made of an alloy containing Ti, Al, Si, C, and oxygen (O). More specifically, concentration of Al lowers from the surface toward the inside (toward the SiC layer), while concentration of Si increases toward the inside, in a direction of thickness of the ohmic contact electrode. In addition, concentration of Ti is highest in a central portion in a direction of thickness, and concentration thereof lowers in any direction toward the surface and the inside. Here, attention being paid to distribution of Si for example, a straight line α along distribution of Si in a region corresponding to SiC, that is, a region where concentration of Si is constant, and a straight line β along a region located on the surface side relative to that region, in which concentration of Si lowers toward the surface, are drawn. Then, an area from the intersection of straight line α and straight line β toward the surface side is the ohmic contact electrode.

It should be understood that the embodiments and the examples disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

A semiconductor device and a method of manufacturing the same according to the present invention can particularly advantageously be applicable to a semiconductor device including an electrode arranged in contact with an SiC layer composed of silicon carbide and a method of manufacturing the same.

DESCRIPTION OF THE REFERENCE SIGNS

1 MOSFET; 3 JFET; 11 n⁺ SiC substrate; 11A one main surface; 11B the other main surface; 12 n⁻ SiC layer; 12A first main surface; 12B second main surface; 13 p body; 13A channel region; 14 n⁺ source region; 15 gate oxide film; 15A thermal oxide film; 16 source contact electrode; 17 gate electrode; 18 p⁺ region; 19 source interconnection; 20 drain electrode; 21 passivation film; 22 source electrode; 31 n-type substrate; 32 first p-type layer; 33 n-type layer; 34 second p-type layer; 34A upper surface; 35 first n-type region; 36 first p-type region; 37 second n-type region; 38 oxide film; 39 source contact electrode; 41 gate contact electrode; 42 drain contact electrode; 43 second p-type region; 44 potential-holding contact electrode; 45 source interconnection; 46 gate interconnection; 47 drain interconnection; 51 Ti film; 52 Al film; 53 Si film; 54 mixture film; 55 Pt film; 61 source electrode; 62 gate electrode; 63 drain electrode; 64 passivation film; 71 groove portion; 71A bottom wall; 71B sidewall; 91 resist film; and 91A opening.

The invention claimed is:
1. A semiconductor device, comprising:
a substrate;
an SiC layer formed on said substrate and composed of silicon carbide; and
an electrode arranged in contact with said SiC layer,
said SiC layer including an n-type region having an n conductivity type, and said electrode including an ohmic contact electrode arranged in contact with said n-type region and containing titanium, aluminum and silicon,
wherein said ohmic contact electrode contains aluminum at least 1.58 times and at most 6.33 times as much as titanium in terms of an atomic ratio.

2. The semiconductor device according to claim 1, wherein
said SiC layer further includes a p-type region having a p conductivity type, and
said ohmic contact electrode is arranged to extend from a region in contact with said n-type region to a region in contact with said p-type region.

3. The semiconductor device according to claim 1, further comprising another electrode different from said electrode, that is arranged in contact with said SiC layer, wherein
said SiC layer further includes a p-type region having a p conductivity type, and
said another electrode includes another ohmic contact electrode different from said ohmic contact electrode, that is arranged in contact with said p-type region and contains titanium, aluminum and silicon.

4. The semiconductor device according to claim 3, wherein
said another ohmic contact electrode contains aluminum at least 1.58 times and at most 6.33 times as much as titanium in terms of an atomic ratio.

5. A method of manufacturing a semiconductor device, comprising the steps of:
preparing a substrate;
forming on said substrate, an SiC layer composed of silicon carbide and including an n-type region having an n conductivity type; and
forming an electrode to be in contact with said SiC layer, and
said step of forming an electrode including the step of forming an ohmic contact electrode arranged in contact with said n-type region and containing titanium, aluminum and silicon;
said step of forming an ohmic contract electrode includes the steps of
forming a Ti layer composed of titanium on said n-type region,
forming an Al layer composed of aluminum on said Ti layer,
forming an Si layer composed of silicon on said Al layer, and
generating an alloy containing titanium, aluminium and silicon by heating said Ti layer, said Al layer and said Si layer.

6. The method of manufacturing a semiconductor device according to claim 5, wherein
in said step of forming an Al layer, said Al layer at least 1.5 times and at most 6 times as thick as said Ti layer is formed.

7. The method of manufacturing a semiconductor device according to claim 5, wherein
in said step of generating an alloy, said Ti layer, said Al layer and said Si layer are heated in a gas mixture of an inert gas and hydrogen.

8. The method of manufacturing a semiconductor device according to claim 5, wherein
said step of forming an ohmic contact electrode further includes the step of forming a Pt layer composed of platinum on said Si layer before said step of generating an alloy.

9. The method of manufacturing a semiconductor device according to claim 5, wherein
said step of forming an ohmic contact electrode includes the steps of
forming a mixture layer containing titanium, aluminum and silicon on said n-type region, and
generating an alloy containing titanium, aluminum and silicon by heating said mixture layer.

10. The method of manufacturing a semiconductor device according to claim 9, wherein
in said step of forming a mixture layer, said mixture layer containing aluminum at least 1.58 times and at most 6.33 times as much as titanium in terms of an atomic ratio is formed.

11. The method of manufacturing a semiconductor device according to claim 9, wherein
in said step of generating an alloy, said mixture layer is heated in a gas mixture of an inert gas and hydrogen.

12. The method of manufacturing a semiconductor device according to claim 9, wherein
said step of forming an ohmic contact electrode further includes the step of forming a Pt layer composed of platinum on said mixture layer before said step of generating an alloy.

13. The method of manufacturing a semiconductor device according to claim 5, wherein
in said step of forming an SiC layer, the SiC layer further including a p-type region having a p conductivity type is formed, and
in said step of forming an ohmic contact electrode, said ohmic contact electrode is formed to extend from a region in contact with said n-type region to a region in contact with said p-type region.

14. The method of manufacturing a semiconductor device according to claim 5, further comprising the step of forming another electrode different from said electrode, to be in contact with said SiC layer, wherein
in said step of forming an SiC layer, the SiC layer further including a p-type region having a p conductivity type is formed,
said step of forming another electrode further includes the step of forming another ohmic contact electrode different from said ohmic contact electrode, that is arranged in contact with said p-type region and contains titanium, aluminum and silicon, and
said step of forming an ohmic contact electrode and said step of forming another ohmic contact electrode are simultaneously performed.

* * * * *

UNITED STATES PATENT AND TRADEMARK OFFICE
CERTIFICATE OF CORRECTION

| | | |
|---|---|---|
| PATENT NO. | : 8,373,176 B2 | Page 1 of 1 |
| APPLICATION NO. | : 12/937450 | |
| DATED | : February 12, 2013 | |
| INVENTOR(S) | : Tamaso et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 111 days.

Signed and Sealed this
Tenth Day of September, 2013

Teresa Stanek Rea
*Acting Director of the United States Patent and Trademark Office*